(12) United States Patent
Eom et al.

(10) Patent No.: US 11,935,993 B2
(45) Date of Patent: Mar. 19, 2024

(54) STRETCHABLE DISPLAY DEVICE

(71) Applicant: LG Display Co., Ltd., Seoul (KR)

(72) Inventors: Hyeseon Eom, Seoul (KR); Jonghyeok Im, Seoul (KR); Doohyun Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 592 days.

(21) Appl. No.: 17/028,605

(22) Filed: Sep. 22, 2020

(65) Prior Publication Data

US 2021/0126172 A1 Apr. 29, 2021

(30) Foreign Application Priority Data

Oct. 24, 2019 (KR) ........................ 10-2019-0132943

(51) Int. Cl.
| | |
|---|---|
| *H01L 29/20* | (2006.01) |
| *H01L 23/538* | (2006.01) |
| *H01L 25/075* | (2006.01) |
| *H01L 27/12* | (2006.01) |
| *H01L 33/00* | (2010.01) |

(Continued)

(52) U.S. Cl.
CPC .......... *H01L 33/62* (2013.01); *H01L 23/5387* (2013.01); *H01L 25/0753* (2013.01); *H01L 27/1214* (2013.01); *G09G 3/32* (2013.01); *G09G 2310/0275* (2013.01); *G09G 2380/02* (2013.01)

(58) Field of Classification Search
CPC . H01L 33/62; H01L 23/5387; H01L 25/0753; H01L 27/1214; H01L 23/49838; H01L 27/1218; H01L 27/1244; H01L 27/3258; H01L 27/3276; H01L 25/167; H01L 27/156; H01L 23/5386; H01L 27/15; H01L 27/32; H01L 51/0097; H01L 2251/5338; G09G 3/32; G09G 2310/0275; G09G 2380/02; G09G 2300/0426;

(Continued)

(56) References Cited

U.S. PATENT DOCUMENTS

| 11,271,179 B2 | 3/2022 | Kim et al. |
| 2018/0046221 A1 | 2/2018 | Choi et al. |

(Continued)

FOREIGN PATENT DOCUMENTS

| DE | 102019119526 A1 | 1/2020 |
| GB | 2576425 A | 2/2020 |

(Continued)

*Primary Examiner* — Ismail A Muse
(74) *Attorney, Agent, or Firm* — Seed IP Law Group LLP

(57) ABSTRACT

A stretchable display device according to present disclosure may include a base substrate, a plurality of first substrates on the base substrate, a plurality of second substrates connecting adjacent first substrates, inorganic insulating layers on the first substrates, an organic insulating layer disposed on the first substrates so as to cover top surfaces and side surfaces of the inorganic insulating layers. The device includes first connection lines disposed on the organic insulating layer on the first substrates and disposed on a second substrate extending in a first direction, second connection lines disposed between the inorganic insulating layers and the organic insulating layer on the first substrates and disposed on a second substrate extending in a second direction, and a step alleviating layer disposed between the second connection lines and the inorganic insulating layers.

21 Claims, 10 Drawing Sheets

(51) Int. Cl.
*H01L 33/62* (2010.01)
*G09G 3/32* (2016.01)

(58) Field of Classification Search
CPC ........ Y02P 70/50; Y02E 10/549; G09F 9/301; G09F 9/302; G06F 1/1652
See application file for complete search history.

(56) References Cited

U.S. PATENT DOCUMENTS

| | | | |
|---|---|---|---|
| 2020/0028102 A1* | 1/2020 | Kim | H10K 59/12 |
| 2020/0161276 A1* | 5/2020 | Kim | G06F 1/1652 |
| 2020/0343463 A1* | 10/2020 | Lee | H10K 59/131 |
| 2021/0233993 A1* | 7/2021 | Kim | H10K 50/86 |
| 2022/0164005 A1* | 5/2022 | Ahn | G06F 1/1652 |

FOREIGN PATENT DOCUMENTS

| | | |
|---|---|---|
| KR | 20040017637 A | 2/2004 |
| KR | 20080014523 A | 2/2008 |

* cited by examiner

STRETCHABLE DISPLAY DEVICE

CROSS-REFERENCE TO RELATED APPLICATION

This application claims the priority of Korean Patent Application No. 10-2019-0132943 filed on Oct. 24, 2019, in the Korean Intellectual Property Office, the disclosure of which is incorporated herein by reference.

BACKGROUND

Technical Field

The present disclosure relates to a stretchable display device, and more particularly to a stretchable display device with an improved reliability of a connection line.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device.

One or more embodiments of the present disclosure provides a stretchable display device which alleviates a step of an insulating layer with which a connection line is in contact to reduce or minimize the separation of the connection line when the stretchable display device is repeatedly extended.

One or more embodiments of the present disclosure provides a stretchable display device which fills an undercut portion caused on the substrate during the manufacturing process to suppress the disconnection of the connection line.

One or more embodiments of the present disclosure provides a stretchable display device which reduces or minimizes a damage of a thin film transistor, a capacitor, and a connection line disposed on the substrate.

One or more embodiments of the present disclosure is to provide a stretchable display device which reduces or minimizes a number of contact points disposed on a first substrate to ensure an area of the first substrate.

Further embodiments of the present disclosure provides a stretchable display device which reduces or minimizes a resistance of a connection line.

Technical benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, a stretchable display device may include a lower substrate; a plurality of first substrates which is disposed on the lower substrate and defines a plurality of sub pixels, a plurality of second substrates which connects adjacent first substrates among the plurality of first substrates; a plurality of inorganic insulating layers disposed on the plurality of first substrates; an organic insulating layer which is disposed on the plurality of first substrates so as to cover top surfaces and side surfaces of the plurality of inorganic insulating layers; a plurality of first connection lines which is disposed on the organic insulating layer on the plurality of first substrates and is disposed on a second substrate extending in a first direction, among the plurality of second substrates; a plurality of second connection lines which is disposed between the plurality of inorganic insulating layers and the organic insulating layer on the plurality of first substrates and is disposed on a second substrate extending in a second direction which is different from the first direction, among the plurality of second substrates; and a step alleviating layer disposed between the plurality of second connection lines and the plurality of inorganic insulating layers.

According to another aspect of the present disclosure, a stretchable display device may include a plurality of rigid substrates which is disposed on a soft substrate and includes a plurality of display elements; a plurality of connection substrates which connects the plurality of rigid substrates between the plurality of rigid substrates; a plurality of inorganic insulating layers disposed on the plurality of rigid substrates; a step alleviating layer which is disposed to cover at least a part of the plurality of inorganic insulating layers; an organic insulating layer disposed on the step alleviating layer; a plurality of first connection lines which is disposed on the organic insulating layer and is disposed on the plurality of connection substrates disposed in one direction; and a plurality of second connection lines which is disposed on a layer different from that of the plurality of first connection lines and extends in a direction different from the plurality of first connection lines.

Other detailed matters of the embodiments are included in the detailed description and the drawings.

According to the present disclosure, separation of the connection line caused when the stretchable display device is repeatedly extended is reduced.

According to the present disclosure, damage of the connection line caused by a stress when the stretchable display device is extended is reduced.

According to the present disclosure, when the light emitting diode is transferred, damages of the thin film transistor, the capacitor, and the connection line disposed on the substrate may be reduced.

According to the present disclosure, an area for disposing a circuit which drives the pixel may be increased.

According to the present disclosure, voltage drop of the connection line may be reduced.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
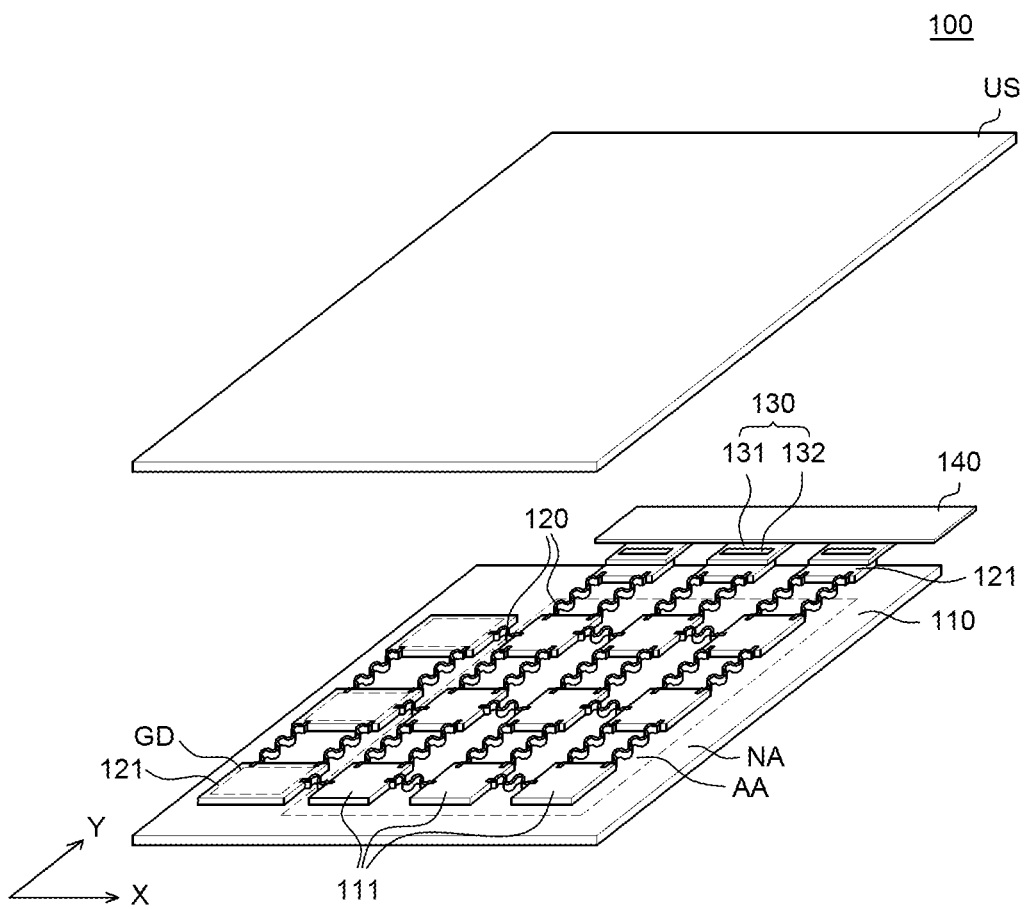
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to embodiments of the present disclosure will be described in detail with reference to accompanying drawings.

Stretchable Display Device

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall surface. Further, when a force applied by the user is removed, the stretchable display device may return to its original shape.

FIG. 1 is an exploded perspective view of a display device according to an embodiment of the present disclosure. Referring to FIG. 1, a stretchable display device 100 includes a lower substrate 110, a plurality of first substrates 111, a plurality of second substrates 120, a plurality of third substrates 121, a chip on film (COF) 130, a printed circuit board 140, and an upper substrate US.

The lower substrate 110 is a substrate which supports and protects several components of the stretchable display device 100. The lower substrate 110 which is a soft substrate may be configured by an insulating material which is bendable or stretchable. For example, the lower substrate 110 may be formed of a silicon rubber such as polydimethylsiloxane (PDMS) or an elastomer such as polyurethane (PU) or polytetrafluoroethylene (PTFE) and thus have a flexible property. However, the material of the lower substrate 110 is not limited thereto.

The lower substrate 110 is a soft substrate so as to be reversibly expanded and contracted. Further, an elastic modulus of the lower substrate 110 may be several MPa to several hundreds of MPa, for example, may be 0.5 MPa to 1 MPa.

The lower substrate 110 may have a display area AA and a non-display area NA enclosing the display area AA.

The display area AA is an area in which an image is displayed in the stretchable display device 100 and a display element and various driving elements for driving the display element are disposed in the display area AA. The display area AA includes a plurality of pixels including a plurality of sub pixels. The plurality of pixels is disposed in the display area AA and includes a plurality of display elements. The plurality of sub pixels may be connected to various wiring lines, respectively. For example, each of the plurality of sub pixels may be connected to various wiring lines such as a gate line, a data line, a high potential power line, a low potential power line, and a reference voltage line.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads (e.g., at least a gate pad 171, at least a data pad 172, or the like) may be disposed, and the pads may be connected to the plurality of sub pixels of the display areas AA, respectively.

The plurality of first substrates 111 and the plurality of third substrates 121 are disposed on the lower substrate 110. The plurality of first substrates 111 may be disposed in the display area AA of the lower substrate 110 and the plurality of third substrates 121 may be disposed in the non-display area NA of the lower substrate 110. Even though in FIG. 1, the plurality of third substrates 121 is disposed at an upper side and a left side of the display area AA in the non-display area NA, it is not limited thereto and may be disposed in an arbitrary area of the non-display area NA.

The plurality of first substrates 111 and the plurality of third substrates 121 are rigid substrates and are spaced apart from each other to be independently disposed on the lower substrate 110. The plurality of first substrates 111 and the plurality of third substrates 121 may be rigider than the lower substrate 110. That is, the lower substrate 110 may have a soft characteristic more than the plurality of first substrates 111 and the plurality of third substrates 121 and the plurality of first substrates 111 and the plurality of third substrates 121 may have a rigid characteristic more than the lower substrate 110.

The plurality of first substrates 111 and the plurality of third substrates 121 which are rigid substrates may be formed of a plastic material having flexibility and for example, may be formed of polyimide (PI), polyacrylate, or polyacetate. In this case, the plurality of first substrates 111 and the plurality of third substrates 121 may be formed of the same or substantially the same material, but are not limited thereto and may be formed of different materials.

The moduli of the plurality of first substrates 111 and the plurality of third substrates 121 may be 1000 times higher than the modulus of the lower substrate 110, but are not limited thereto. For example, elastic moduli of the plurality of first substrates 111 and the plurality of third substrates 121 may be 2 GPa to 9 GPa depending on a transparency. More specifically, when the plurality of first substrates 111 and the plurality of third substrates 121 are transparent, the elastic modulus is 2 GPa, and when the plurality of first substrates 111 and the plurality of third substrates 121 are opaque, the elastic modulus is 9 GPa. Therefore, the plurality of first substrates 111 and the plurality of third substrates 121 may be a plurality of rigid substrates having rigidity as compared with the lower substrate 110.

In some embodiments, the lower substrate 110 may be defined to include a plurality of first lower patterns and a plurality of second lower patterns. The plurality of first lower patterns is disposed in an area of the lower substrate 110 overlapping the plurality of first substrates 111 and the plurality of third substrates 121. The plurality of second lower patterns may be disposed in an area excluding an area where the plurality of first substrates 111 and the plurality of second substrates 121 are disposed or may be disposed in the entire stretchable display device 100.

In this case, moduli of the plurality of first lower patterns may be higher than moduli of the second lower patterns. For example, the plurality of first lower patterns may be formed of the same or substantially the same material as the plurality of first substrates 111 and the second lower pattern may be formed of a material having a modulus lower than that of the plurality of first substrates 111.

The COF 130 is a film on which various components are disposed on a base film 131 having a malleability and supplies signals to the plurality of sub pixels of the display area AA. The COF 130 may be bonded to the plurality of pads of the plurality of third substrates 121 disposed in the non-display area NA and supplies a power voltage, a data voltage, or a gate voltage to the plurality of sub pixels of the display area AA through the pads. The COF 130 includes the base film 131 and a driving IC 132. Further, various components may be additionally disposed thereon.

The base film 131 is a layer which supports the driving IC 132 of the COF 130. The base film 131 may be formed of an insulating material, and for example, may be formed of an insulating material having a flexibility.

The driving IC 132 is a component which processes data for displaying images and a driving signal for processing the images. In FIG. 1, even though it is illustrated that the driving IC 132 is mounted by the COF 130 technique, it is not limited thereto and the driving IC 132 may be mounted by chip on glass (COG) or tape carrier package (TCP).

In FIG. 1, one third substrate 121 is disposed in the non-display area AA→NA at the upper side of the display area AA so as to correspond to one row of first substrates 111 disposed in the display area AA and one COF 130 is disposed for one third substrate 121, but is not limited thereto. That is, one third substrate 121 and one COF 130 may be disposed so as to correspond to a plurality of rows of first substrates 111.

A control unit such as an IC chip or a circuit unit may be mounted on the printed circuit board 140. Further, on the printed circuit board 140, a memory or a processor may be mounted. The printed circuit board 140 is a component which transmits a signal for driving the display element from the control unit to the display element. Even though in FIG. 1, it is described that three printed circuit boards 140 are used, the number of printed circuit boards 140 is not limited thereto.

Hereinafter, the stretchable display device 100 according to the embodiment of the present disclosure will be described in more detail with reference to FIGS. 2 and 3.

Planar and Cross-Sectional Structures

Figure 2:
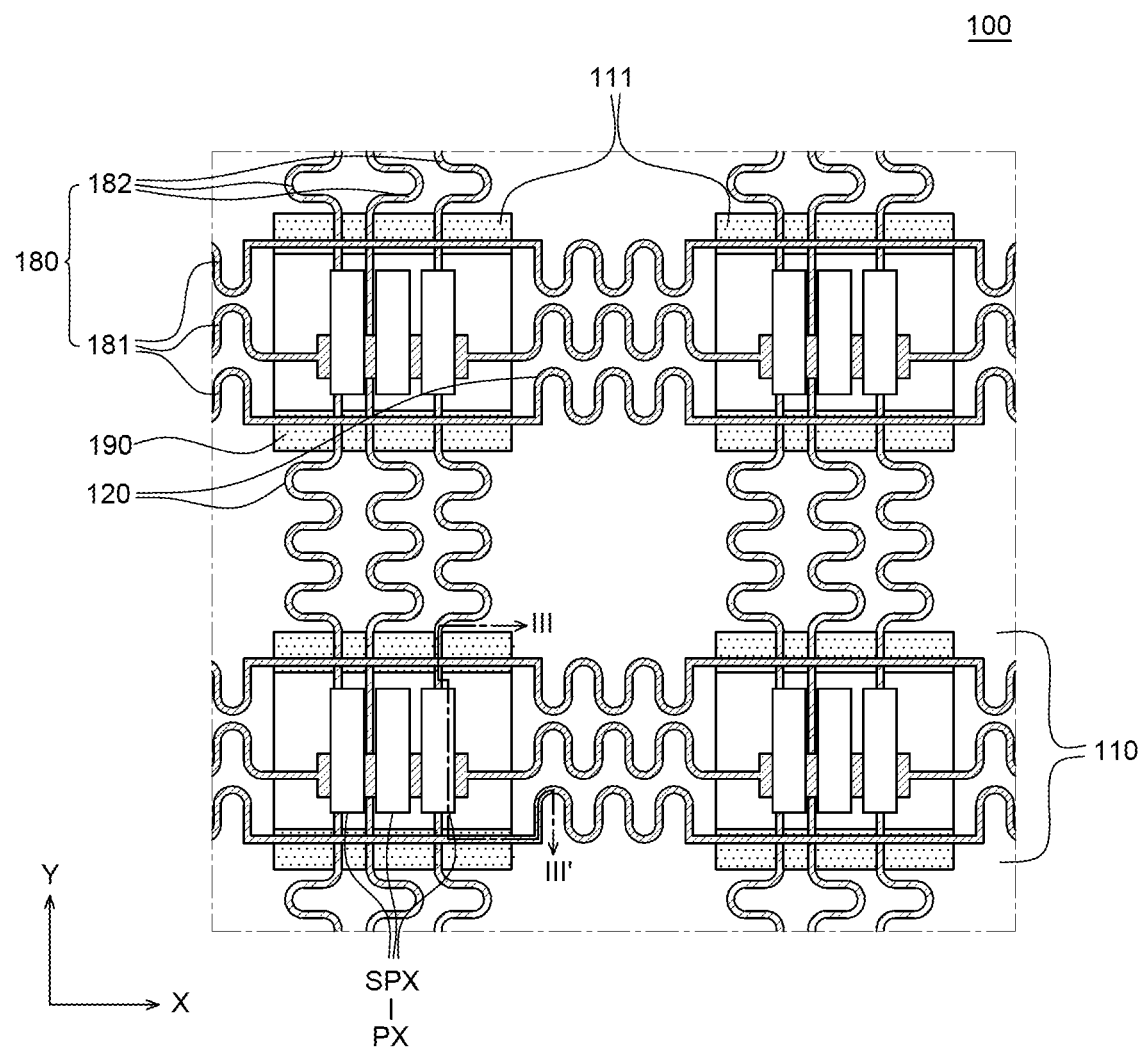
FIG. 2 is an enlarged plan view of a stretchable display device according to an embodiment of the present disclosure.

FIG. 2 is an enlarged plan view of a stretchable display device according to an embodiment of the present disclosure. FIG. 3 is a schematic cross-sectional view of one sub pixel of FIG. 2. For the convenience of description, the description will be made also with reference to FIG. 1.

Referring to FIGS. 1 and 2, the plurality of first substrates 111 is disposed on the lower substrate 110 in the display area AA. The plurality of first substrates 111 is spaced apart from each other to be disposed on the lower substrate 110. For example, as illustrated in FIGS. 1 and 2, the plurality of first substrates 111 may be disposed on the lower substrate 110 in a matrix, but is not limited thereto.

Referring to FIGS. 1 and 2, a plurality of sub pixels SPX which configures the plurality of pixels PX may be disposed on the plurality of first substrates 111 and a gate driver GD may be mounted on a third substrate 121 located at a left side of the display area AA, among the plurality of third substrates 121. The gate driver GD may be formed on the third substrate 121 in a gate in panel (GIP) manner when various components on the first substrate 111 are manufactured. Therefore, various circuit configurations which configure the gate driver GD, such as various transistors, capacitors, and wiring lines, may be disposed on the plurality of third substrates 121. However, it is not limited thereto and the gate driver GD may be mounted in a chip on film (COF) manner. Further, the plurality of third substrates 121 may also be disposed in the non-display area NA located at a right side of the display area AA and the gate driver GD may also be mounted in the plurality of third substrates 121 located at the right side of the display area AA.

Referring to FIG. 1, sizes of the plurality of third substrates 121 may be larger than sizes of the plurality of first substrates 111. Specifically, a size of each of the plurality of third substrates 121 may be larger than a size of each of the plurality of first substrates 111. As described above, on each of the plurality of third substrates 121, the gate driver GD is disposed. For example, one stage of the gate driver GD may be disposed on each of the plurality of third substrates 121. Therefore, an area occupied by various circuit configurations which configure one stage of the gate driver GD is relatively larger than an area of the first substrate 111 in which the pixel PX is disposed. As a result, a size of each of the plurality of third substrates 121 may be larger than a size of each of the plurality of first substrates 111.

Referring to FIGS. 1 and 2, the plurality of second substrates 120 is disposed between the plurality of first substrates 111, between the plurality of third substrates 121, or between the plurality of first substrates 111 and the plurality of third substrates 121. The plurality of second substrates 120 is substrates which connect adjacent first substrates 111, adjacent third substrates 121, or between the first substrate 111 and the third substrate 121 and may be referred to as connection substrates. The plurality of second substrates 120 may be simultaneously and integrally formed with the same or substantially the same material as the first substrates 111 or the third substrate 121, but is not limited thereto.

Referring to FIG. 2, a step alleviating layer 190 is disposed on the plurality of first substrates 111. The step alleviating layer 190 is disposed to cover one ends and the other ends of the plurality of first substrates 111 on which the plurality of second connection lines 182 is disposed so that the plurality of second connection lines 182 may be disposed on the step alleviating layer 190. The step alleviating layer 190 will be described in more detail with reference to FIG. 3.

Referring to FIG. 2, the plurality of second substrates 120 has a wavy shape. For example, as illustrated in FIG. 2, the plurality of second substrates 120 may have a sine wave shape. However, the shape of the plurality of second substrates 120 is not limited thereto and the plurality of second substrates 120 may extend with a zigzag pattern or may be formed with various shapes such as a shape extended by connecting a plurality of rhombus-shaped substrates at vertexes. Further, the number and the shape of the plurality of second substrates 120 illustrated in FIG. 2 are illustrative and the number and the shape of the plurality of second substrates 120 may vary depending on the design.

Referring to FIG. 2, the plurality of connection lines 180 is disposed on the plurality of first substrates 111 with a straight line shape. Specifically, the plurality of first connection lines 181 and the plurality of second connection lines 182 may be continuously formed on the plurality of first substrates 111 to connect one ends and the other ends of the plurality of first substrates 111.

Referring to FIG. 2, the plurality of connection lines 180 has a shape corresponding to the plurality of second substrates 120, on the plurality of second substrates 120. That is, the plurality of connection lines 180 may have a sine wave shape. The plurality of connection lines 180 electrically connects pads on adjacent first substrates 111, among the plurality of first substrates 111, and extends between the pads with a wavy shape, rather than a straight line shape. For example, as illustrated in FIG. 2, the shape of the plurality of connection lines 180 is not limited thereto. For example, the plurality of connection lines 180 may extend with a zigzag pattern. Further, the plurality of connection lines 180 may have various shapes such as a shape extended by connecting a plurality of rhombus shaped wiring lines 180 at vertexes.

Figure 3:
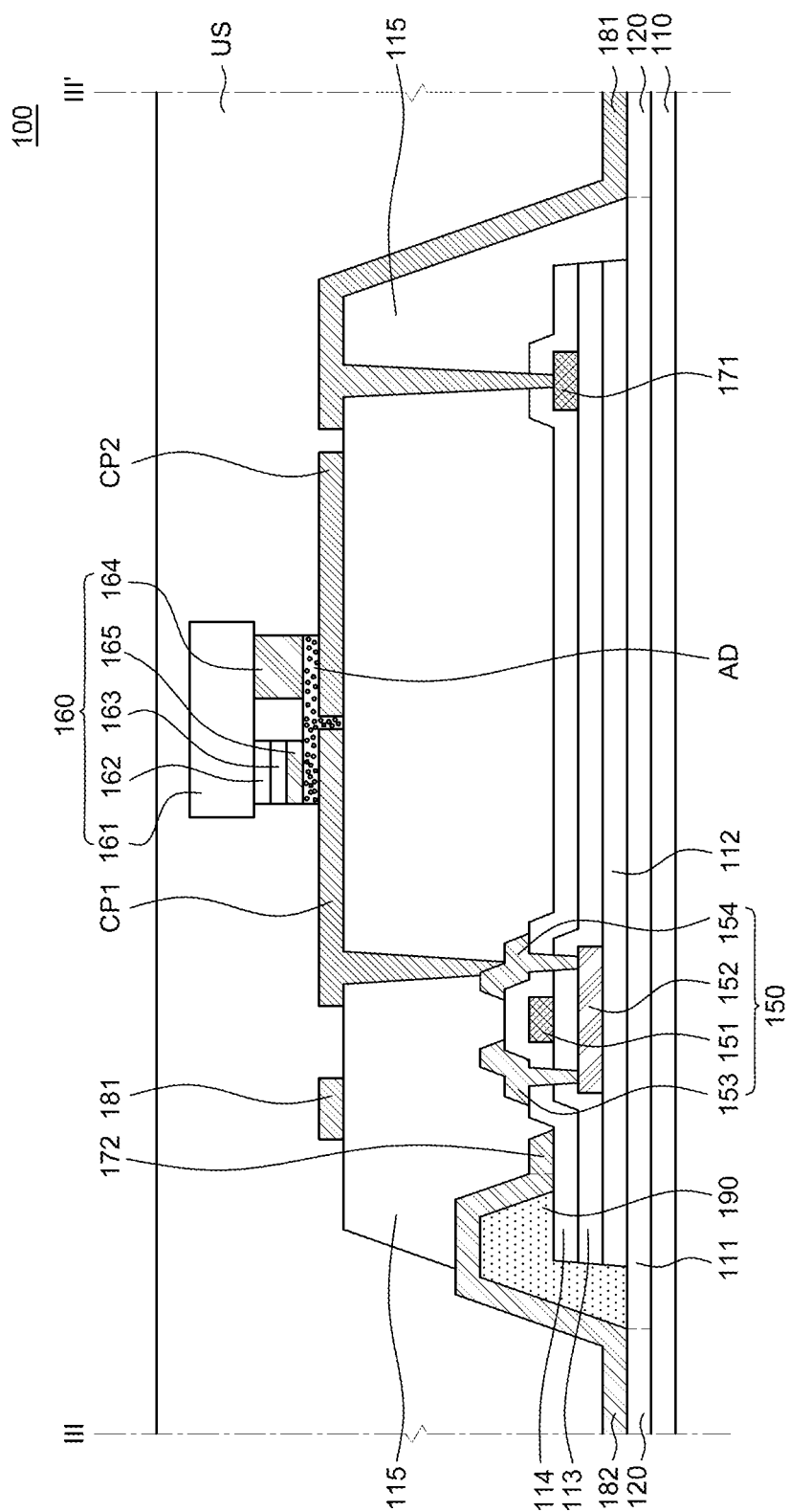
FIG. 3 is a cross-sectional view taken along the line of FIG. 2.

Referring to FIG. 3, a plurality of inorganic insulating layers is disposed on the plurality of first substrates 111. For example, the plurality of inorganic insulating layers may include a buffer layer 112, a gate insulating layer 113, and an interlayer insulating layer 114, but is not limited thereto. Therefore, various inorganic insulating layers may be additionally disposed on the plurality of first substrates 111 or one or more of the buffer layer 112, the gate insulating layer 113, and the interlayer insulating layer 114 may be omitted.

Referring to FIG. 3, the buffer layer 112 is disposed on the plurality of first substrates 111. The buffer layer 112 is formed on the plurality of first substrates 111 to protect various components of the stretchable display device 100 from permeation of moisture $H_2O$ and oxygen $O_2$ from the outside of the lower substrate 110 and the plurality of first substrates 111. The buffer layer 112 may be configured by an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

In this case, the buffer layer 112 may be formed only in an area overlapping the plurality of first substrates 111 and the plurality of third substrates 121. As described above, the buffer layer 112 may be formed of an inorganic material so that the buffer layer 112 may be easily cracked or damaged during a process of extending the stretchable display device 100. Therefore, the buffer layer 112 is not formed in an area between the plurality of first substrates 111 and the plurality of third substrates 121. Instead, the buffer layer 112 is patterned to have a shape of the plurality of first substrates 111 and the plurality of third substrates 121 to be disposed only above the plurality of first substrates 111 and the plurality of third substrates 121. Therefore, in the stretchable display device 100 according to the embodiment of the present disclosure, the buffer layer 112 is formed only in an area overlapping the plurality of first substrates 111 and the plurality of third substrates 121 which are rigid substrates. Therefore, even though the stretchable display device 100 is bent or stretched to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor, amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the buffer layer 112. The gate electrode 151 is disposed to overlap the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and may be formed of an inorganic material, similarly to the buffer layer 112. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the gate insulating layer 113 and the interlayer insulating layer 114 are patterned to be formed only in an area overlapping the plurality of first substrates 111. The gate insulating layer 113 and the interlayer insulating layer 114 may also be formed of the inorganic material, similarly to the buffer layer 112, so that the gate insulating layer 113 and the interlayer insulating layer 114 may also be easily cracked to be damaged during the process of extending the stretchable display device 100. Therefore, the gate insulating layer 113 and the interlayer insulating layer 114 are not formed in an area between the plurality of first substrates 111, but are patterned to have a shape of the plurality of first substrates 111 to be formed only above the plurality of first substrates 111.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors such as a staggered transistor may also be used.

Referring to FIG. 3, a gate pad 171 among the plurality of pads is disposed on the gate insulating layer 113. The gate pad 171 is a pad which transmits a gate signal to the plurality of sub pixels SPX. The gate signal may be transmitted to the gate electrode 151 from the gate pad 171 through a gate line formed on the first substrate 111. The gate pad 171 may be formed of the same or substantially the same material on the same layer as the gate electrode 151. However, the present disclosure is not limited thereto and the gate pad 171 may be disposed on a different layer from the gate electrode 151 and may be formed of the different material therefrom.

Referring to FIG. 3, the step alleviating layer 190 is disposed on the interlayer insulating layer 114. The step alleviating layer 190 is disposed between the plurality of second connection lines 182 and the plurality of inorganic insulating layers such as the buffer layer 112, the gate insulating layer 113, and the interlayer insulating layer 114, on the plurality of first substrates 111. By doing this, the step alleviating layer 190 may relieve the step of the plurality of second connection lines 182 disposed on a side surface of the plurality of inorganic insulating layers.

The step alleviating layer 190 may be formed of an organic material. For example, the step alleviating layer 190 may be formed of the same or substantially the same material as the planarization layer 115 or formed of an organic material having an adhesiveness with the plurality of second connection lines 182 stronger than the planarization layer 115, but is not limited thereto.

Referring to FIG. 3, the step alleviating layer 190 may be disposed on the plurality of first substrates 111 to cover a part of a top surface and side surfaces of the plurality of inorganic insulating layers. The step alleviating layer 190 encloses the buffer layer 112, the gate insulating layer 113, and the interlayer insulating layer 114 together with the plurality of first substrate 111, between the plurality of first substrates 111 and the plurality of second connection lines 182. Specifically, the step alleviating layer 190 may be disposed so as to cover a top surface and a side surface of the interlayer insulating layer 114, a side surface of the gate insulating layer 113, a side surface of the buffer layer 112, and a part of a top surface of the plurality of first substrates 111. Therefore, the step alleviating layer 190 may supplement a step on the side surfaces of the buffer layer 112, the gate insulating layer 113, and the interlayer insulating layer 114 between the plurality of first substrates 111 and the plurality of second connection lines 182. Further, the step alleviating layer 190 may increase an adhesive strength between the step alleviating layer 190 and the plurality of second connection lines 182 disposed on the side surface of the step alleviating layer 190.

Referring to FIG. 3, a data pad 172, among the plurality of pads, is disposed on the interlayer insulating layer 114. The data pad 172 is a pad which transmits a data signal to the plurality of sub pixels SPX. The data signal may be transmitted to the source electrode 153 or the drain electrode 154 from the data pad 172 through a data line formed on the first substrate 111. The data pad 172 may be formed of the same or substantially the same material on the same layer as the source electrode 153 and the drain electrode 154. However, the present disclosure is not limited thereto and the data pad 172 may be disposed on a different layer from the source electrode 153 and the drain electrode 154 and may be formed of the different material therefrom.

Referring to FIG. 3, a planarization layer 115 is formed on the transistor 150, the interlayer insulating layer 114, and the step alleviating layer 190. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic-based organic material, but is not limited thereto. The planarization layer 115 may be formed of the same or substantially the same material as the step alleviating layer 190 or formed of an organic material having an adhesiveness with the plurality of first connection lines 181 stronger than the step alleviating layer 190, but is not limited thereto.

Referring to FIG. 3, the planarization layer 115 is disposed between the plurality of first substrates 111 and the first connection line 181 to cover top surfaces and side surfaces of the buffer layer 112, the gate insulating layer 113, and the interlayer insulating layer 114. The planarization layer 115 is disposed to enclose the buffer layer 112, the gate insulating layer 113, and the interlayer insulating layer 114 together with the plurality of first substrates 111. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of first substrates 111. Therefore, the planarization layer 115 may supplement a step on the side surfaces of the buffer layer 112, the gate insulating layer 113, and the interlayer insulating layer 114 between the plurality of first substrates 111 and the plurality of first connection lines 181. Further, the planarization layer 115 may increase an adhesive strength between the planarization layer 115 and the plurality of first connection lines 181 disposed on the side surface of the planarization layer 115.

In the meantime, a slope of the side surface of the planarization layer 115 may be gentler than a slope formed by side surfaces of the buffer layer 112, the gate insulating layer 113, and the interlayer insulating layer 114, but is not limited thereto.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layers, but is not limited thereto.

Referring to FIGS. 2 and 3, the connection line 180 refers to a wiring line which electrically connects pads on the plurality of first substrates 111 or the plurality of third substrates 121. The connection line 180 is disposed on the first substrates 111 and the plurality of second substrates 120.

The connection lines 180 include a first connection line 181 and a second connection line 182. The first connection line 181 and the second connection line 182 are disposed on the plurality of first substrates 111 and the plurality of second substrates 120. Specifically, the first connection line 181 refers to a wiring line disposed on a second substrate 120 which extends in an X-axis direction which is a first direction, among the plurality of second substrates 120, and the plurality of the first substrates 111. The second connection line 182 refers to a wiring line disposed on a second substrate 120 which extends in a Y-axis direction which is a second direction, among the plurality of second substrates 120, and the plurality of the first substrates 111. The connection line 180 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

The plurality of first connection lines 181 and the plurality of second connection lines 182 may be configured by different materials. For example, the plurality of first connection lines 181 may be configured by copper (Cu) and the plurality of second connection lines 182 may be configured by a stacked structure of titanium/aluminum/titanium (Ti/Al/Ti).

The plurality of first connection lines 181 and the plurality of second connection lines 182 may be disposed on different layers. For example, the plurality of first connection lines 181 may be disposed on the planarization layer 115 on the plurality of first substrates 111 and the plurality of second connection lines 182 may be disposed on the step alleviating layer 190 disposed between the plurality of inorganic insulating layers and the planarization layer 115, on the plurality of first substrates 111. Therefore, the plurality of first connection lines 181 and the plurality of second connection lines 182 may overlap with each other on the plurality of first substrates 111.

In the case of a general display device, various wiring lines such as a plurality of gate lines and a plurality of data lines extend between the plurality of sub pixels with a straight line shape and the plurality of sub pixels is connected to one signal line. Therefore, in the general display device, various wiring lines such as a gate line, a data line, a high potential power line, and a reference voltage line extend from one side to the other side of the display device without being disconnected on the substrate.

In contrast, in the stretchable display device 100 according to the embodiment of the present disclosure, various wiring lines such as a gate line, a data line, a high potential power line, or a reference voltage line having a straight line shape which are considered to be used for the general display device may be disposed only on the plurality of first substrates 111 and the plurality of third substrates 121. That is, in the stretchable display device 100 according to the embodiment of the present disclosure, a straight wiring line is disposed only on the plurality of first substrates 111 and the plurality of third substrates 121.

In the stretchable display device 100 according to the embodiment of the present disclosure, in order to connect discontinuous wiring lines on the first substrate 111 or the third substrate 121, two adjacent first substrates 111 or two adjacent third substrates 121 may be connected by the connection line 180. Specifically, the first connection line 181 electrically connects pads on two first substrates 111, on two third substrates 121, and on the first substrate 111 and the third substrate 121, which are adjacent to each other in the X-axis direction which is a first direction. Further, the second connection line 182 electrically connects two first substrates 111, two third substrates 121, and the first substrate 111 and the third substrate 121, which are adjacent to each other in the Y-axis direction which is a second direction. Accordingly, the stretchable display device 100 according to the embodiment of the present disclosure may include a plurality of connection lines 180 which electrically connects various wiring lines, such as a gate line, a data line, a high potential power line, and a reference voltage line, between the plurality of first substrates 111, between the plurality of third substrates 121, and between the plurality of first substrates 111 and the plurality of third substrates 121. For example, the gate line may be disposed on the plurality of first substrates 111 disposed to be adjacent to each other in the X-axis direction and the gate pad 171 may be disposed on both ends of the gate line. In this case, the plurality of gate pads 171 on the plurality of first substrates 111 adjacent to each other in the X-axis direction may be connected to each other by the first connection line 181 which serves as a gate line. Therefore, the gate line disposed on the plurality of first substrates 111 and the first connection line 181 disposed on the third substrate 121 may serve as one gate line. Further, wiring lines which extend in the X-axis direction, among all various wiring lines which may be included in the stretchable display device 100, such as an emission signal line, a low potential power line, and a high potential power line, may also be electrically connected by the first connection line 181, as described above.

Referring to FIGS. 2 and 3, the first connection line 181 may connect pads on two first substrates 111 which are disposed side by side among the pads on the plurality of first substrates 111 which is disposed to be adjacent to each other in the X-axis direction. The first connection line 181 may serve as a gate line, an emission signal line, a high potential power source line, or a low potential power source line, but is not limited thereto. For example, the first connection line 181 may serve as a gate line and electrically connect the gate pads 171 on two first substrates 111 which are disposed side by side in the X-axis direction. Therefore, as described above, the gate pads 171 on the plurality of first substrates 111 disposed in the X-axis direction may be connected by the first connection line 181 serving as a gate line and transmit one gate signal.

Referring to FIG. 2, the second connection line 182 may connect two first substrates 111 which are disposed side by side among the plurality of first substrates 111 which is disposed to be adjacent to each other in the Y-axis direction. The second connection line 182 may serve as a data line, a high potential power line, a low potential power line, or a reference voltage line, but is not limited thereto. For example, the second connection line 182 may serve as a data line and electrically connect the data lines on two first substrates 111 which are disposed side by side in the Y-axis direction. Therefore, as described above, the data lines above the plurality of first substrates 111 disposed in the Y-axis direction may be connected by the plurality of second connection line 182 serving as a data line and transmit one data signal.

Referring to FIG. 1, the connection line 180 may further include a wiring line which connects pads on the plurality of first substrates 111 and the plurality of third substrates 121 or connects pads on two third substrates 121 disposed side by side, among pads on the plurality of third substrates 121 disposed to be adjacent to each other in the Y-axis direction.

The first connection line 181 may be formed to extend to a top surface of the second substrate 120 while being in contact with a top surface and a side surface of the planarization layer 115 disposed on the first substrate 111. Further, the second connection line 182 may be formed to extend to a top surface of the second substrate 120 while being in contact with a top surface and a side surface of the step alleviating layer 190 disposed on the first substrate 111. The arrangement and the effects of the first connection line 181 and the second connection line 182 will be described below in more detail.

In the meantime, even though it is not illustrated in FIG. 3, a bank may be formed on a first connection pad CP1, a second connection pad CP2, the connection line 180, and the planarization layer 115. The bank may serve to distinguish adjacent sub pixels SPX.

Referring to FIG. 3, an LED 160 is disposed on the first connection pad CP1 and the second connection pad CP2. The LED 160 includes an n-type layer 161, an active layer 162, a p-type layer 163, an n-electrode 164, and a p-electrode 165. The LED 160 of the stretchable display device 100 according to the embodiment of the present disclosure has a flip-chip structure in which the n-electrode 164 and the p-electrode 165 are formed on one surface.

The n-type layer 161 may be formed by injecting an n-type impurity into gallium nitride (GaN) having excellent crystallinity. The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure is manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other is etched to expose a part of the n-type layer 161. In other words, the surfaces of the LED 160 on which the n-electrode 164 and the p-electrode 165 are disposed are not flat surfaces, but have different height levels.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 may also be formed of a conductive material, and for example, may be formed of the same or substantially the same material as the n-electrode 164.

An adhesive layer AD is disposed on top surfaces of the first connection pad CP1 and the second connection pad CP2 and between the first connection pad CP1 and the second connection pad CP2 so that the LED 160 may be bonded onto the first connection pad CP1 and the second connection pad CP2. In this case, the n-electrode 164 may be disposed on the second connection pad CP2 and the p-electrode 165 may be disposed on the first connection pad CP1.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n-electrode 164 is electrically connected to the second connection line 182 by means of the adhesive layer AD and the p-electrode 165 is electrically connected to the first connection line 181 by means of the adhesive layer AD. That is, after applying the adhesive layer AD on the first connection pad CP1 and the second connection pad CP2 using an inkjet method, the LED 160 is transferred onto the adhesive layer AD and the LED 160 is pressurized and heated. By doing this, the first connection pad CP1 may be electrically connected to the p-electrode 165 and the second connection pad CP2 may be electrically connected to the n-electrode 164. However, the remaining part of the adhesive layer AD excluding a part of the adhesive layer AD disposed between the n-electrode 164 and the second connection pad CP2 and a part of the adhesive layer AD disposed between the p-electrode 165 and the first connection pad CP1 has an insulating property. In the meantime, the adhesive layer AD may be divided to be disposed on the first connection pad CP1 and the second connection pad CP2, respectively.

As described above, the stretchable display device 100 according to the embodiment of the present disclosure has a structure in which the LED 160 is disposed on the lower substrate 110 on which the transistor 150 is disposed. Therefore, when the stretchable display device 100 is turned on, different voltage levels which are applied to the first connection pad CP1 and the second connection pad CP2 are transmitted to the n-electrode 164 and the p-electrode 165 so that the LED 160 emits light.

Referring to FIG. 3, the upper substrate US is disposed on the LED 160 and the lower substrate 110.

The upper substrate US is a substrate which supports various components disposed below the upper substrate US. Specifically, the upper substrate US is formed by coating a material which configures the upper substrate US on the lower substrate 110 and the first substrate 111 and then curing the material to be disposed to be in contact with the lower substrate 110, the first substrate 111, the second substrate 120, and the connection line 180.

The upper substrate US which is a soft substrate may be configured by an insulating material which is bendable or extendable. The upper substrate US is a soft substrate so as to be reversibly expanded and contracted. Further, an elastic modulus of the upper substrate may be several MPa to several hundreds of MPa and an extension rupture ratio may be 100% or higher. A thickness of the upper substrate US may be 10 μm to 1 mm, but is not limited thereto.

The upper substrate US may be formed of the same or substantially the same material as the lower substrate 110. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIG. 3, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

In the stretchable display device of the related art, the planarization layer which is formed of an organic insulating material is disposed on a plurality of inorganic insulating layers, such as a buffer layer, a gate insulating layer, and an interlayer insulating layer, without covering side surfaces of the plurality of inorganic insulating layers. Therefore, the connection line is disposed so as to be in contact with the side surfaces of the plurality of inorganic insulating layers. However, if a patterning process, that is, an etching process is performed on the plurality of inorganic insulating layers, steps of the side portions of the plurality of inorganic insulating layers may be caused. That is, a slope of the side surfaces of the plurality of inorganic insulating layers formed by the etching process is very steep so that when the connection line is directly formed on the side portions of the plurality of inorganic insulating layers, disconnection of the connection line may be caused.

Therefore, in the stretchable display device 100 according to the embodiment of the present disclosure, the planarization layer 115 is disposed between the plurality of first substrates 111 and the first connection line 181 to cover the side surface of the plurality of inorganic insulating layers. By doing this, the step of the side surface of the plurality of inorganic insulating layers may be supplemented. Specifically, the planarization layer 115 may be disposed between the plurality of first substrates 111 and the first connection line 181 to cover top surfaces and side surfaces of the plurality of inorganic insulating layers, that is, a side surface of the buffer layer 112, a side surface of the gate insulating layer 113, and a part of a top surface and a side surface of the interlayer insulating layer 114. When the planarization layer 115 is disposed to cover the side surfaces of the plurality of inorganic insulating layers, the side surface of the planarization layer 115 may be formed to have a slope gentler than a slope formed by the side surfaces of the plurality of inorganic insulating layers. Therefore, the plurality of first connection lines 181 disposed on the planarization layer 115 is disposed to have a relatively gentle slope so that the crack generated in the plurality of first connection lines 181 when the plurality of first connection lines 181 is formed may be reduced. Further, when the stretchable display device 100 is extended, the stress generated in the plurality of first connection lines 181 is reduced and the crack of the plurality of first connection lines 181 or the separation of the first connection line 181 from the side surface of the planarization layer 115 may be suppressed.

Further, in the stretchable display device 100 according to the embodiment of the present disclosure, the step alleviating layer 190 is disposed at one ends and the other ends of the plurality of first substrates 111 on which the plurality of second connection lines 182 is disposed. Further, the step alleviating layer 190 is disposed between the plurality of first substrates 111 and the second connection line 182 to cover the side surfaces of the plurality of inorganic insulating layers to supplement the steps of the side surfaces of the plurality of inorganic insulating layers. The step alleviating layer 190 may be disposed between the plurality of first substrates 111 and the second connection line 182 to cover top surfaces and side surfaces of the plurality of inorganic insulating layers, that is, a side surface of the buffer layer 112, a side surface of the gate insulating layer 113, and a part of a top surface and a side surface of the interlayer insulating layer 114. In this case, the step alleviating layer 190 is disposed to have a slope gentler than a slope formed by the side surfaces of the plurality of inorganic insulating layers so that the plurality of second connection lines 182 disposed on the step alleviating layer 190 may be disposed to have a relatively gentler slope. Therefore, the crack generated in the plurality of second connection lines 182 when the plurality of second connection lines 182 is formed may be reduced. Further, when the stretchable display device 100 is extended, the stress generated in the plurality of second connection lines 182 is reduced and the crack of the plurality of second connection lines 182 or the separation of the second connection line 182 from the side surface of the step alleviating layer 190 may be suppressed.

When the plurality of first connection lines and the plurality of second connection lines are disposed on the same layer in the stretchable display device, the plurality of first connection lines and the plurality of second connection lines do not intersect on the plurality of first substrates. Therefore, at least one of the plurality of first connection lines and the plurality of second connection lines disposed at one end of the plurality of first substrates is connected to a wiring line or a pad disposed on another layer through a contact hole disposed on the plurality of first substrates to be electrically connected to the plurality of first connection lines and the plurality of second connection lines disposed at the other end of the plurality of first substrates. However, when the plurality of first connection lines and the plurality of second connection lines are connected to a wiring line or a pad disposed on the other layer through the contact hole, a contact resistance is increased. Further, since it is beneficial for a process margin of forming a contact hole to be considered, an area of the plurality of first substrates on which a pixel, a driving circuit, or a wiring line is disposed may be reduced by an area of the plurality of first substrates occupied by the contact hole.

Accordingly, in the stretchable display device 100 according to the embodiment of the present disclosure, the plurality of first connection lines 181 and the plurality of second connection lines 182 are disposed on different layers to overlap with each other on the plurality of first substrates 111. That is, the plurality of first connection lines 181 is continuously formed on the plurality of first substrates 111 and the plurality of second substrates 120, but is not electrically connected by a pad or a wiring line disposed on the other layer. Further, the plurality of second connection lines 182 is continuously formed on the plurality of first substrates 111 and the plurality of second substrates 120, but is not electrically connected by a pad or a wiring line disposed on the other layer. The plurality of first connection lines 181 and the plurality of second connection lines 182 may be connected to the other configuration through a contact hole to transmit a signal to the other circuit configuration such as a transistor 150. However, a contact hole is not used to connect between the plurality of first connection lines 181 and the plurality of second connection lines 182. Accordingly, in the stretchable display device 100 according to the embodiment of the present disclosure, a contact resistance for the plurality of first connection lines 181 and the plurality of second connection lines 182 may be reduced. Further, areas of the pixels, the driving circuits, and the wiring lines which may be disposed in the plurality of first substrates 111 may be increased. Further, the number of contact holes disposed on the plurality of first substrates 111 is reduced so that the pixels, the driving circuits, and the wiring lines may be more freely designed.

Further, in the stretchable display device 100 according to the embodiment of the present disclosure, the planarization layer 115 and the step alleviating layer 190 are disposed to cover the side portions of the plurality of inorganic insulating layers. Therefore, the disconnection of the connection line 180 caused when the connection line 180 is formed may be reduced. Specifically, portions of the plurality of first substrates 111 adjacent to the ends of the plurality of inorganic insulating layers are also etched during the process of etching the buffer layer 112, the gate insulating layer 113, and the interlayer insulating layer 114, to have an undercut shape. The planarization layer 115 and the step alleviating layer 190 may be disposed to cover one side and the other side of the plurality of first substrates 111. Therefore, the planarization layer 115 and the step alleviating layer 190 may supplement an undercut shape formed in a portion adjacent to the end of the plurality of inorganic insulating layers. Further, the first connection line 181 is disposed on the planarization layer 115 and the second connection line 182 is disposed on the step alleviating layer 190 so that the disconnection of the connection line 180 caused when the connection line 180 is formed may be reduced.

Arrangement of Step Alleviating Layer

Figure 4:
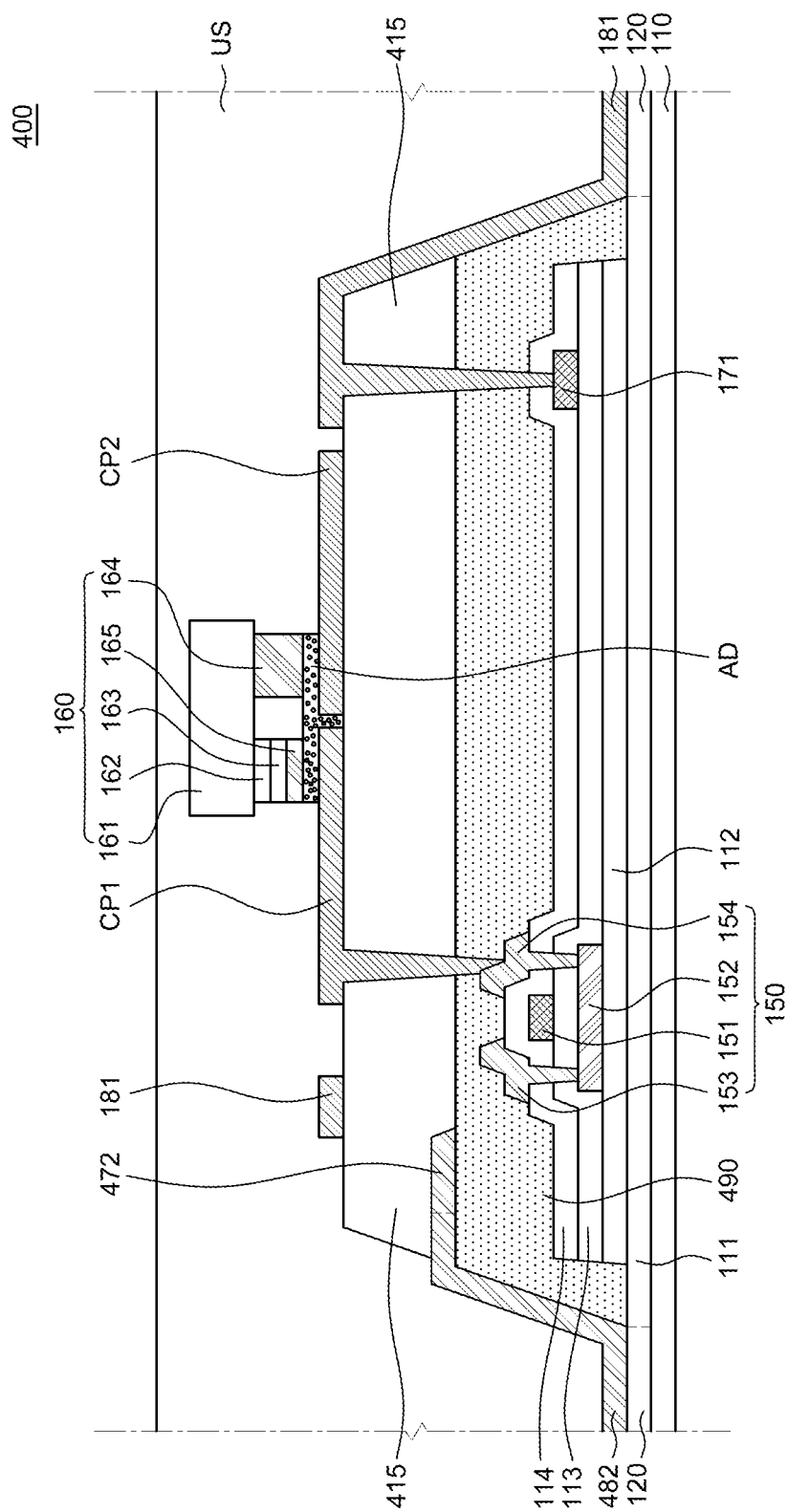
FIG. 4 is a schematic cross-sectional view of one sub pixel of a stretchable display device according to another embodiment of the present disclosure.

FIG. 4 is a schematic cross-sectional view of one sub pixel of a stretchable display device according to another embodiment of the present disclosure. The only difference between a stretchable display device 400 of FIG. 4 and the stretchable display device 100 of FIGS. 1 to 3 is a step alleviating layer 490, a planarization layer 415, and a plurality of connection lines (e.g., at least a plurality of first connection lines 181, at least a plurality of second connection lines 482, or the like), but the other configuration is the same or substantially the same, so that a redundant description will be omitted.

Referring to FIG. 4, the step alleviating layer 490 is disposed to cover top surfaces and side surfaces of the plurality of inorganic insulating layers. That is, the step alleviating layer 490 may be disposed to cover the plurality of inorganic insulating layers. Specifically, the step alleviating layer 490 is disposed on the plurality of first substrates 111 to cover a top surface and a side surface of the interlayer insulating layer 114, a side surface of the gate insulating layer 113, a side surface of the buffer layer 112, and a part of top surfaces of the plurality of first substrates 111. By doing this, the step alleviating layer 490 may be disposed to enclose the plurality of inorganic insulating layers together with the plurality of first substrates 111. In this case, a slope of the side surface of the step alleviating layer 490 may be gentler than a slope of the side surface formed by the plurality of inorganic insulating layers, but is not limited thereto.

Referring to FIG. 4, a data pad 472, among a plurality of pads 470, is disposed on the step alleviating layer 490. Therefore, the data pad 472 may be connected to the plurality of second connection lines 482 on the step alleviating layer 490. The data pad 472 may be formed of the same or substantially the same material as the second connection line 482.

Referring to FIG. 4, the plurality of second connection lines 482 is disposed on the step alleviating layer 490. Specifically, the plurality of second connection lines 482 is connected to the data pad 472 on the step alleviating layer 490 to have a flat top surface on the top surface of the step alleviating layer 490 and may be disposed to be in contact with a part of the top surface and the side surface of the step alleviating layer 490.

Referring to FIG. 4, the planarization layer 415 is disposed on the plurality of pads 470 and the step alleviating layer 490. The planarization layer 415 is disposed to cover the top surface of the step alleviating layer 490, the data pad 472 of the plurality of pads 470, and a part of the top surface of the plurality of second connection lines 482. In this case, a slope of the side surface of the planarization layer 415 may be equal to a slope of the side surface of the step alleviating layer 490, but is not limited thereto. Further, even though in FIG. 4, it is illustrated that the planarization layer 415 covers only the top surface of the step alleviating layer 490, the present disclosure is not limited thereto and the planarization layer 415 may also be disposed to cover a part of the side surface of the step alleviating layer 490.

Referring to FIG. 4, the plurality of first connection lines 181 is disposed on the planarization layer 415. The plurality of first connection lines 181 is connected to the gate pad through contact holes formed in the planarization layer 415 and the step alleviating layer 490. The plurality of first connection lines 415 is in contact with a top surface and a side surface of the planarization layer 415 and a side surface of the step alleviating layer 490 and may extend to the top surface of the plurality of second substrates.

In the stretchable display device 400 according to another embodiment of the present disclosure, the step alleviating layer 490 and the planarization layer 415 are disposed on the plurality of inorganic insulating layers, such as the buffer layer 112, the gate insulating layer 113, and the interlayer insulating layer 114, and the transistor 150. By doing this, during the transferring process of the LED 160, the components disposed below the step alleviating layer 490 and the planarization layer 415 may be protected. When the LED 160 is disposed in the stretchable display device 400 by being transferred thereon, the LED 160 may be disposed by pressurizing the LED 160 above the stretchable display device 400. In this case, the transistor 150, various wiring lines, and the connection line disposed below the LED 160 may be damaged due to the pressure. Accordingly, the step alleviating layer 490 and the planarization layer 415 are disposed on the buffer layer 112, the gate insulating layer 113, the interlayer insulating layer 114, and the transistor 150 so that when the LED 160 is transferred, the stress due to the pressurization may be alleviated. Consequently, the damages of the transistor 150, various wiring lines, and the connection line disposed below the step alleviating layer 490 and the planarization layer 415 may be reduced.

Planarization Layer Including Groove

Figure 5:
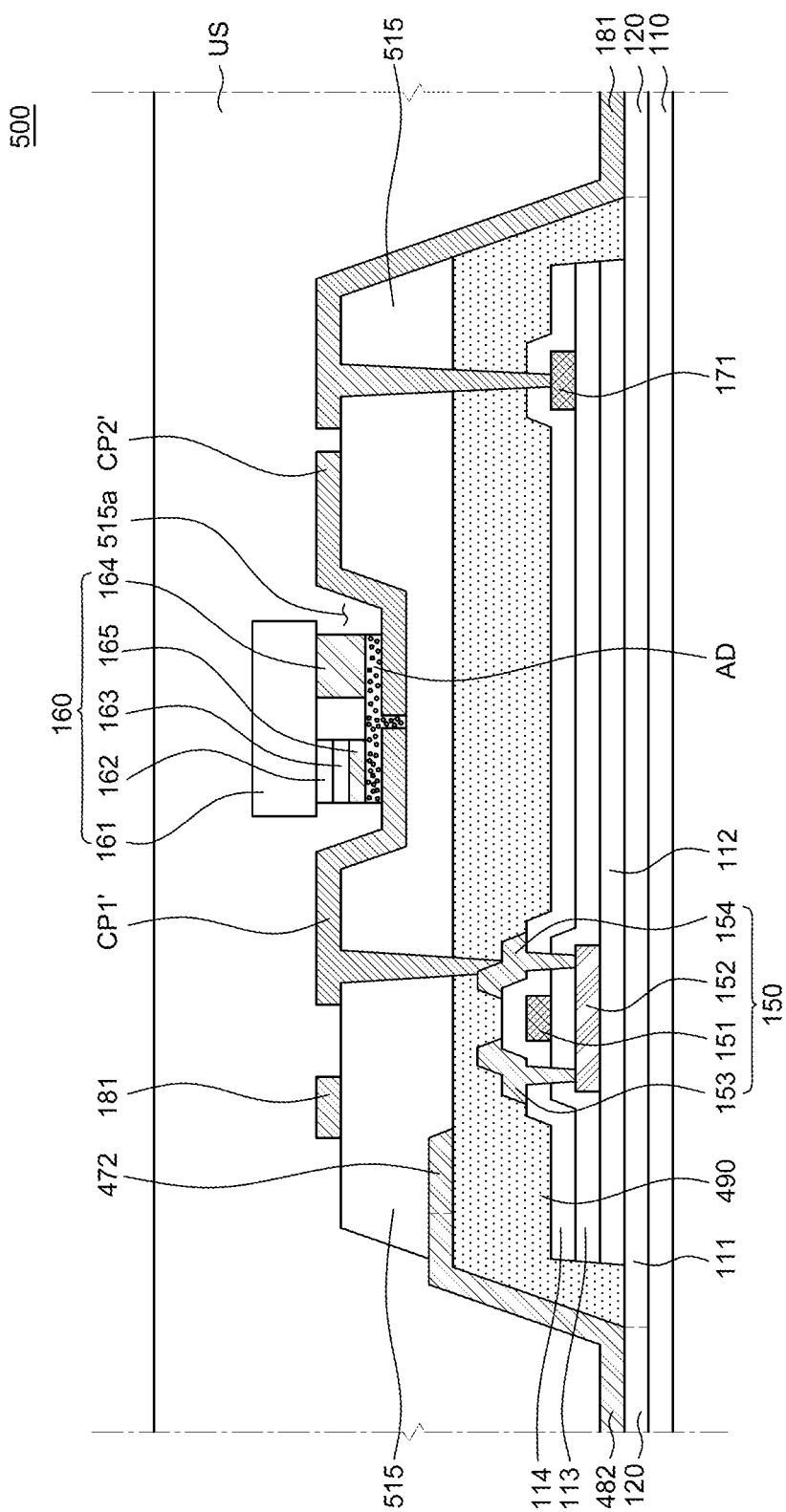
FIG. 5 is a schematic cross-sectional view of one sub pixel of a stretchable display device according to still another embodiment of the present disclosure.

FIG. 5 is a schematic cross-sectional view of one sub pixel of a stretchable display device according to still another embodiment of the present disclosure. The only difference between a stretchable display device 500 of FIG. 5 and the stretchable display device 400 of FIG. 4 is a planarization layer 515 and a connection pad (e.g., at least a first connection pad CP1', at least a second connection pad CP2', or the like), but the other configuration is the same or substantially the same, so that a redundant description will be omitted.

Referring to FIG. 5, the planarization layer 515 includes a groove 515a. The groove 515a may be disposed on a part of a top surface of the planarization layer 515. The groove 515a may have a predetermined depth so that the LED 160 may be seated therein.

Referring to FIG. 5, the connection pad may be disposed in accordance with a shape of the groove 515a. Specifically, a first connection pad CP1' and a second connection pad CP2' may extend along an inner side surface and a part of a top surface of the groove 515a on a part of the top surface of the planarization layer 515. Therefore, the first connection pad CP1' and the second connection pad CP2' may be disposed to mostly cover the inner side surface and the top surface of the groove 515a. However, the present disclosure is not limited thereto and the first connection pad CP1' and the second connection pad CP2' may be disposed to cover only a part of the inner side surface or a part of the top surface of the groove 515a.

Referring to FIG. 5, the LED 160 may be disposed in the groove 515a of the planarization layer 515. The LED 160 may be electrically connected to the first connection pad CP1' and the second connection pad CP2' disposed in the groove 515a of the planarization layer 515.

In the stretchable display device 500 according to still another embodiment of the present disclosure, the groove 515a is disposed in a part of the top surface of the planarization layer 515 to allow the LED 160 to be aligned during the process of transferring the LED 160. Specifically, when the groove 515a is disposed in a part of the top surface of the planarization layer 515, during the process of transferring the LED 160, the LED 160 may be transferred in accordance with the shape of the groove 515a. That is, the groove 515a of the planarization layer 515 may guide a line by which the LED 160 is transferred. Accordingly, the groove 515a is disposed on the top surface of the planarization layer 515 so that the groove 515a of the planarization layer 515 guides the line by which the LED 160 is transferred to align the LED 160 on the planarization layer 515.

In the stretchable display device 500 according to still another embodiment of the present disclosure, the LED 160 is disposed in the groove 515a of the planarization layer 515 to implement a cavity. When the LED 160 is disposed in the groove 515a of the planarization layer 515, some of light emitted from the LED 160 may be reflected by the first connection pad CP1' and the second connection pad CP2' formed of a metal material which are disposed on the inner side surface of the groove 515a. Therefore, a path of light emitted from the LED 160 is changed by the first connection pad CP1' and the second connection pad CP2' to be extracted to a front direction of the stretchable display device 500. Accordingly, the LED 160 is disposed in the groove 515a of the planarization layer 515 to extract some of light emitted from the LED 160 to a front direction of the stretchable display device 500 by the first connection pad CP1' and the second connection pad CP2', thereby increasing a front extraction efficiency of the stretchable display device 500.

Connection Line with Dual Structure

Figure 6:
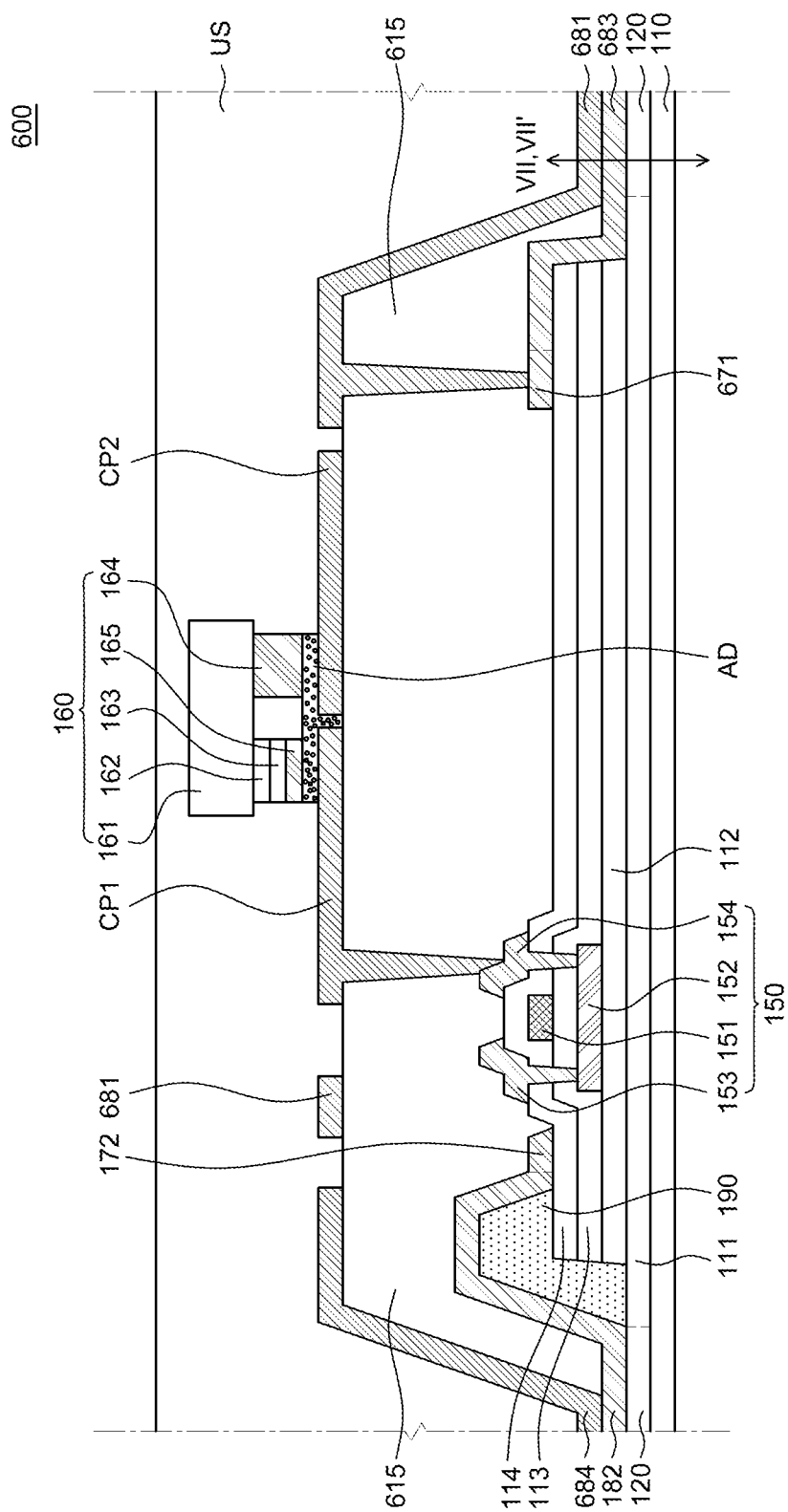
FIG. 6 is a schematic cross-sectional view of one sub pixel of a stretchable display device according to still another embodiment of the present disclosure.
Figure 7:
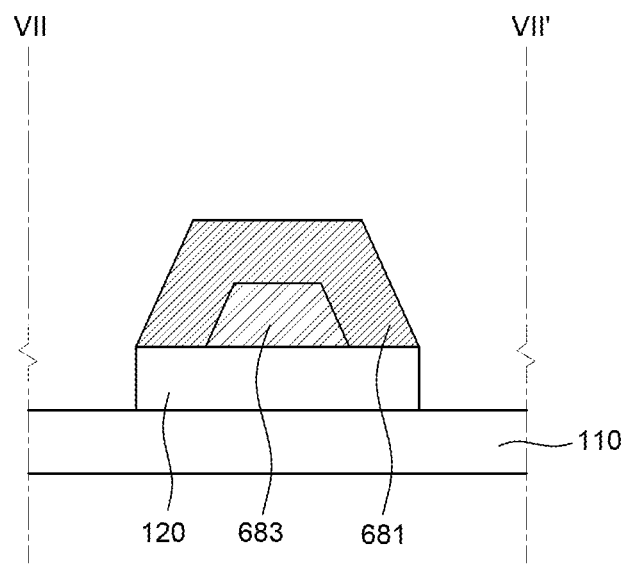
FIG. 7 is a cross-sectional view taken along the line VII-VII' of FIG. 6.

FIG. 6 is a schematic cross-sectional view of one sub pixel of a stretchable display device according to still another embodiment of the present disclosure. FIG. 7 is a cross-sectional view taken along the line VII-VII' of FIG. 6. The only difference between a stretchable display device 600 of FIGS. 6 and 7 and the stretchable display device 100 of FIGS. 1 to 3 is a planarization layer 615, a plurality of pads (e.g., at least a gate pad 671, at least a data pad 172, or the like), and a plurality of connection lines (e.g., a plurality of first connection lines 681, a plurality of second connection lines 682, a plurality of third connection lines 683, a plurality of fourth connection lines 684, or the like), but the other configuration is the same or substantially the same, so that a redundant description will be omitted.

Referring to FIG. 6, the plurality of connection lines 680 includes a plurality of third connection lines 683. The plurality of third connection lines 683 may be disposed between the plurality of inorganic insulating layers and an organic insulating layer, on the plurality of first substrates 111. Specifically, the plurality of third connection lines 683 may be disposed between the interlayer insulating layer 114 of the plurality of inorganic insulating layers and the planarization layer 615. The plurality of third connection lines 683 is connected to the gate pad 671 disposed on the top surface of the interlayer insulating layer 114 to be in contact with a part of the top surface and the side surface of the interlayer insulating layer 114, a side surface of the gate insulating layer 113, a side surface of the buffer layer 112, and a part of the top surface of the plurality of first substrates 111.

Referring to FIG. 6, the plurality of third connection lines 683 may extend onto the plurality of second substrates 120. The plurality of third connection lines 683 is disposed on the second substrate 120 which extends in the X-axis direction which is a first direction to be in contact with a top surface of the second substrate 120 extending in the first direction and a bottom surface of the plurality of first connection lines 681.

Referring to FIG. 6, the planarization layer 615 is disposed on the transistor 150, the plurality of second connection lines 182, and the plurality of third connection lines 683. The planarization layer 615 is disposed between the plurality of first connection lines 681 and the plurality of third connection lines 683 to be in contact with top surfaces and side surfaces of the plurality of third connection lines 683. Further, the planarization layer 615 is disposed between the plurality of second connection lines 182 and a plurality of fourth connection lines 684 to be in contact with top surfaces and side surfaces of the plurality of second connection lines 182. However, the present disclosure is not limited thereto and the planarization layer 615 may also be disposed to cover only the top surfaces of the plurality of third connection lines 683 and the top surfaces of the plurality of second connection lines 182.

Referring to FIG. 6, the plurality of first connection lines 681 is disposed on the planarization layer 615. The plurality of first connection lines 681 may be disposed to be in contact with the top surface and the side surface of the planarization layer 615. Further, the plurality of first connection lines 681 may be disposed on the plurality of third connection lines 683 on the second substrate 120. That is, the bottom surface of the plurality of first connection lines 681 is disposed to be in contact with a part of the top surface of the plurality of third connection lines 683 so that the plurality of first connection lines 681 and the plurality of third connection lines 683 which are in contact with each other may transmit the same signal.

Referring to FIG. 7, the plurality of first connection lines 681 may be disposed to enclose the plurality of third connection lines 683. For example, the plurality of first connection lines 681 may be disposed to cover the top surfaces and the side surfaces of the plurality of third connection lines 683. In this case, a cross-section of the plurality of first connection lines 681 and the plurality of third connection lines 683 on the plurality of second substrates 120 may be a trapezoidal shape, but is not limited thereto.

Referring to FIG. 6 again, the plurality of connection lines 680 includes a plurality of fourth connection lines 684. The plurality of fourth connection lines 684 is disposed to be in contact with a part of the top surface and the side surface of the planarization layer 615 to extend onto the plurality of second substrates 120 which extends in the Y-axis direction which is a second direction. The plurality of fourth connection lines 684 may be disposed on the plurality of second substrates 120 to be in contact with the top surface of the plurality of second connection lines 182. That is, the top surface of the plurality of second connection lines 182 is disposed to be in contact with a part of the bottom surface of the plurality of fourth connection lines 684 so that the plurality of second connection lines 182 and the plurality of fourth connection lines 684 which are in contact with each other may transmit the same signal.

In the meantime, the plurality of fourth connection lines 684 and the plurality of second connection lines 182 may be disposed with the same or substantially the same structure as the plurality of first connection lines 681 and the plurality of third connection lines 683. That is, the plurality of fourth connection lines 684 may be disposed on the plurality of second substrates 120 to enclose the plurality of second connection lines 182, but is not limited thereto.

In the stretchable display device 600 according to still another embodiment of the present disclosure, the plurality of third connection lines 683 and the plurality of fourth connection lines 684 are disposed to be in contact with the plurality of first connection lines 681 and the plurality of second connection lines 182. By doing this, the resistance of the connection line 680 may be reduced. Therefore, in the stretchable display device 600 according to still another embodiment of the present disclosure, voltage drop of a signal transmitted through the connection line 680 may be reduced. For example, the longer the lengths of the plurality of first connection lines 681 and the plurality of second connection lines 182, the larger the resistance. However, as described above, the plurality of first connection lines 681 and the plurality of second connection lines 182 have a wavy shape, like the second substrate 120 so that the resistance may be high as compared with a straight line shape. Therefore, the voltage transmitted through the plurality of first connection lines 681 and the plurality of second connection lines 182, for example, a high potential voltage and a low potential voltage may drop or rise so that voltages which are transmitted to the sub pixels SPX may vary. As a result, a luminance of each sub pixel SPX may be irregular. Accordingly, in the stretchable display device 600 according to still another embodiment of the present disclosure, the plurality of third connection lines 683 and the plurality of first connection lines 681 and the plurality of fourth connection lines 684 and the plurality of second connection lines 182 are disposed with a parallel structure. By doing this, the resistance generated in the plurality of first connection lines 681 and the plurality of second connection lines 182 may be reduced and a voltage deviation in each sub pixel SPX is reduced so that the luminance irregularity in each sub pixel SPX may be reduced. In some embodiments, a portion of the plurality of fourth connection lines 684 is directly on and contacting a corresponding portion of the plurality of second connection lines 182, and another portion of the plurality of fourth connection lines 684 is spaced apart from and having a substantially similar shape as another portion of the plurality of second connection lines 182. Similarly, in some embodiments, a portion of the plurality of first connection lines 681 is directly on and contacting a corresponding portion of the plurality of third connection lines 683, and another portion of the plurality of first connection lines 681 is spaced apart from and having a substantially similar shape as another portion of the plurality of third connection lines 683.

Further, in the stretchable display device 600 according to still another embodiment of the present disclosure, the plurality of first connection lines 681 may be disposed to enclose the plurality of third connection lines 683 and the plurality of fourth connection lines 684 may be disposed to enclose the plurality of second connection lines 182. Therefore, during the manufacturing process of the plurality of first connection lines 681 and the plurality of fourth connection lines 684, for example, during the etching process, the loss of the plurality of third connection lines 683 and the plurality of second connection lines 182 may be suppressed.

Third Connection Line Disposed on Step Alleviating Layer

Figure 8:
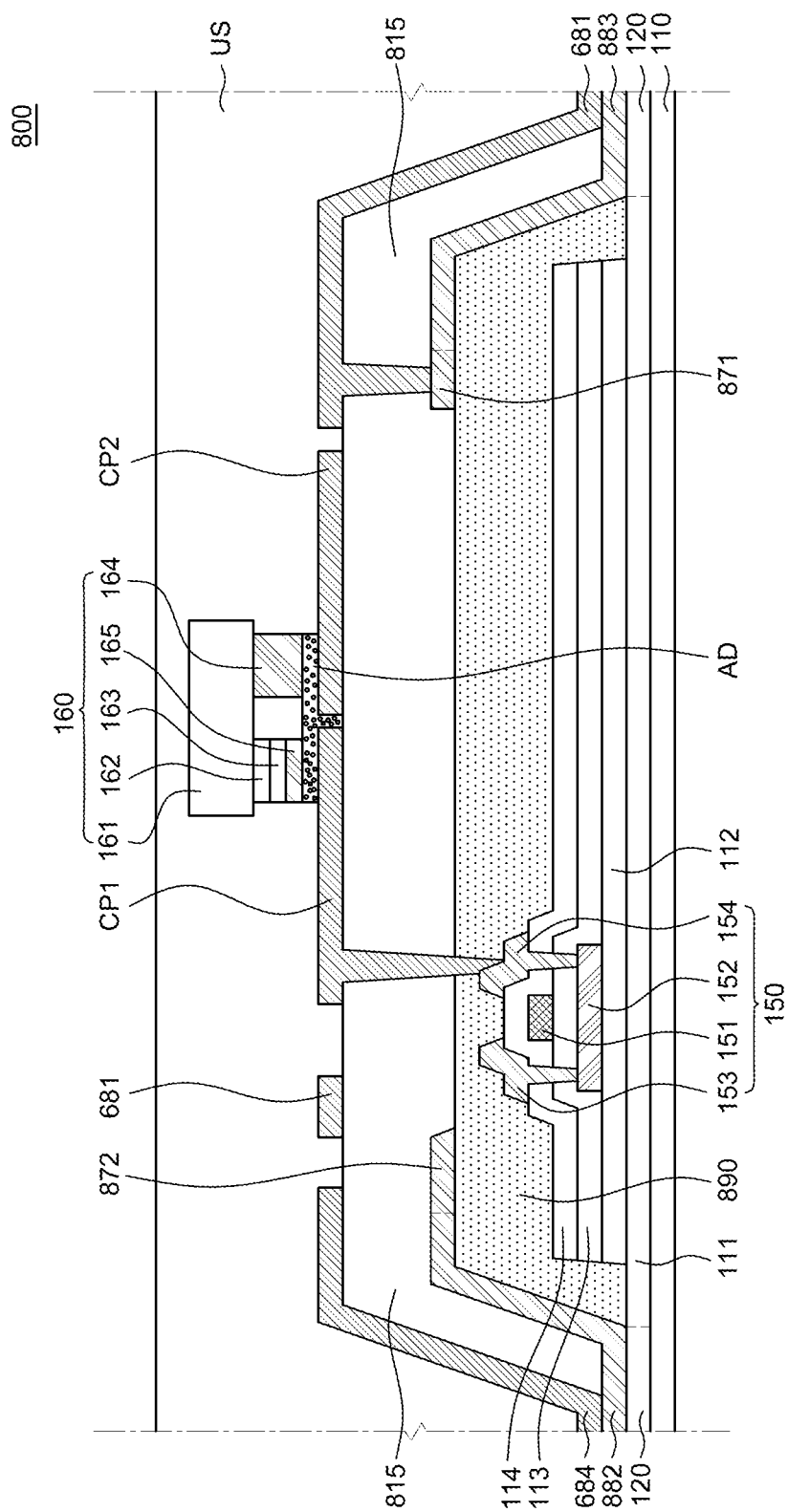
FIG. 8 is a schematic cross-sectional view of one sub pixel of a stretchable display device according to still another embodiment of the present disclosure.

FIG. 8 is a schematic cross-sectional view of one sub pixel of a stretchable display device according to still another embodiment of the present disclosure. The only difference between a stretchable display device 800 of FIG. 8 and the stretchable display device 600 of FIGS. 6 and 7 is a plurality of pads (e.g., at least a gate pad 871, at least a data pad 872, or the like), a step alleviating layer 890, and a plurality of connection lines (e.g., at least a plurality of first connection lines 681, at least a plurality of second connection lines 882, at least a plurality of second connection lines 883, at least a plurality of fourth connection lines 684, or the like), but the other configuration is the same or substantially the same, so that a redundant description will be omitted.

Referring to FIG. 8, the step alleviating layer 890 is disposed to cover top surfaces and side surfaces of the plurality of inorganic insulating layers. That is, the step alleviating layer 890 is disposed to cover the plurality of inorganic insulating layers. Specifically, the step alleviating layer 890 may be disposed between the plurality of first substrates 111 and a plurality of second connection lines 882 and between the plurality of first substrates 111 and a plurality of third connection lines 883 to cover the top surface and the side surface of the interlayer insulating layer 114, the side surface of the gate insulating layer 113, the side surface of the buffer layer 112, and a part of the top surface of the plurality of first substrates 111. Therefore, the step alleviating layer 890 may be disposed to enclose the plurality of inorganic insulating layers together with the plurality of first substrates 111. In this case, a slope of the side surface of the step alleviating layer 890 may be gentler than a slope of the side surface formed by the plurality of inorganic insulating layers, but is not limited thereto.

Referring to FIG. 8, a plurality of pads is disposed on the step alleviating layer 890. Specifically, among the plurality of pads, a gate pad 871 is connected to the plurality of third connection lines 883 on the step alleviating layer 890 and a data pad 872 may be connected to the plurality of second connection lines 882 on the step alleviating layer 890. In this case, the gate pad 871 may be configured by the same or substantially the same material as the plurality of third connection lines 883 and the data pad 872 may be configured by the same or substantially the same material as the plurality of second connection lines 882.

Referring to FIG. 8, the plurality of second connection lines 882 and the plurality of third connection lines 883 are disposed on the step alleviating layer 890. The plurality of second connection lines 882 and the plurality of third connection lines 883 may be disposed on a top surface of the step alleviating layer 890 to have flat top surfaces. Therefore, the plurality of second connection lines 882 and the plurality of third connection lines 883 may be disposed to be in contact with a part of the top surface and the side surface of the step alleviating layer 890 on one side and the other side of the step alleviating layer 890, respectively. The plurality of second connection lines 882 and the plurality of third connection lines 883 may be configured by the same or substantially the same material as the source electrode 153 or the drain electrode 154, but are not limited thereto.

Referring to FIG. 8, a planarization layer 815 is disposed on the transistor 150, the plurality of second connection lines 882, and the plurality of third connection lines 883. The planarization layer 815 is disposed between the plurality of first connection lines 681 and the plurality of third connection lines 883 to be in contact with top surfaces and side surfaces of the plurality of third connection lines 883. Further, the planarization layer 815 is disposed between the plurality of second connection lines 882 and the plurality of fourth connection lines 684 to be in contact with top surfaces and side surfaces of the plurality of second connection lines 882. However, the present disclosure is not limited thereto and the planarization layer 815 may also be disposed to cover only the top surfaces of the plurality of third connection lines 883 and the top surfaces of the plurality of second connection lines 882.

Referring to FIG. 8, the plurality of first connection lines 681 is disposed on the planarization layer 815. The plurality of first connection lines 681 is connected to the gate pad 871 through a contact hole formed on the planarization layer 815 to be in contact with a part of the top surface and the side surface of the planarization layer 815. Further, the plurality of first connection lines 681 may be disposed on the plurality of third connection lines 883 on the second substrate 120. That is, bottom surfaces of the plurality of first connection lines 681 may be disposed to be in contact with a part of the top surfaces of the plurality of third connection lines 883.

In the stretchable display device 800 according to still another embodiment of the present disclosure, the step alleviating layer 890 is disposed between the plurality of third connection lines 883 and the plurality of inorganic insulating layers. By doing this, a step of the side surfaces of the plurality of inorganic insulating layers on which the plurality of third connection lines 883 is disposed may be supplemented. Specifically, the step alleviating layer 890 may be disposed between the plurality of first substrates 111 and the plurality of third connection line 883 to cover top surfaces and side surfaces of the plurality of inorganic insulating layers, that is, a side surface of the buffer layer 112, a side surface of the gate insulating layer 113, and a part of a top surface and a side surface of the interlayer insulating layer 114. In this case, the side surface of the step alleviating layer 890 is formed to have a slope gentler than a slope of side surfaces formed by the plurality of inorganic insulating layers so that the plurality of third connection lines 883 may also be disposed on the step alleviating layer 890 with a gentle slope. By doing this, the crack generated on the plurality of third connection lines 883 when the plurality of third connection lines 883 is formed may be reduced. Further, the adhesive strength of the plurality of third connection lines 883 is increased so that the crack of the plurality of third connection lines 883 or separation from the side surface of the step alleviating layer 890 may be suppressed. Further, when the stretchable display device 800 is extended, a stress generated in the plurality of third connection lines 883 may be reduced.

Further, in the stretchable display device 800 according to still another embodiment of the present disclosure, the step alleviating layer 890 and the planarization layer 815 are disposed on the plurality of inorganic insulating layers, such as the buffer layer 112, the gate insulating layer 113, and the interlayer insulating layer 114, and the transistor 150. By doing this, during the transferring process of the LED 160, the components disposed below the step alleviating layer 490 and the planarization layer 415 may be protected. That is, the step alleviating layer 890 and the planarization layer 815 are disposed on the buffer layer 112, the gate insulating layer 113, the interlayer insulating layer 114, and the transistor 150 so that when the LED 160 is transferred, the stress due to the pressurization may be alleviated. Consequently, the damages of the transistor 150, various wiring lines, and the connection line 880 disposed below the step alleviating layer 890 and the planarization layer 815 may be reduced.

Fifth Connection Line

Figure 9:
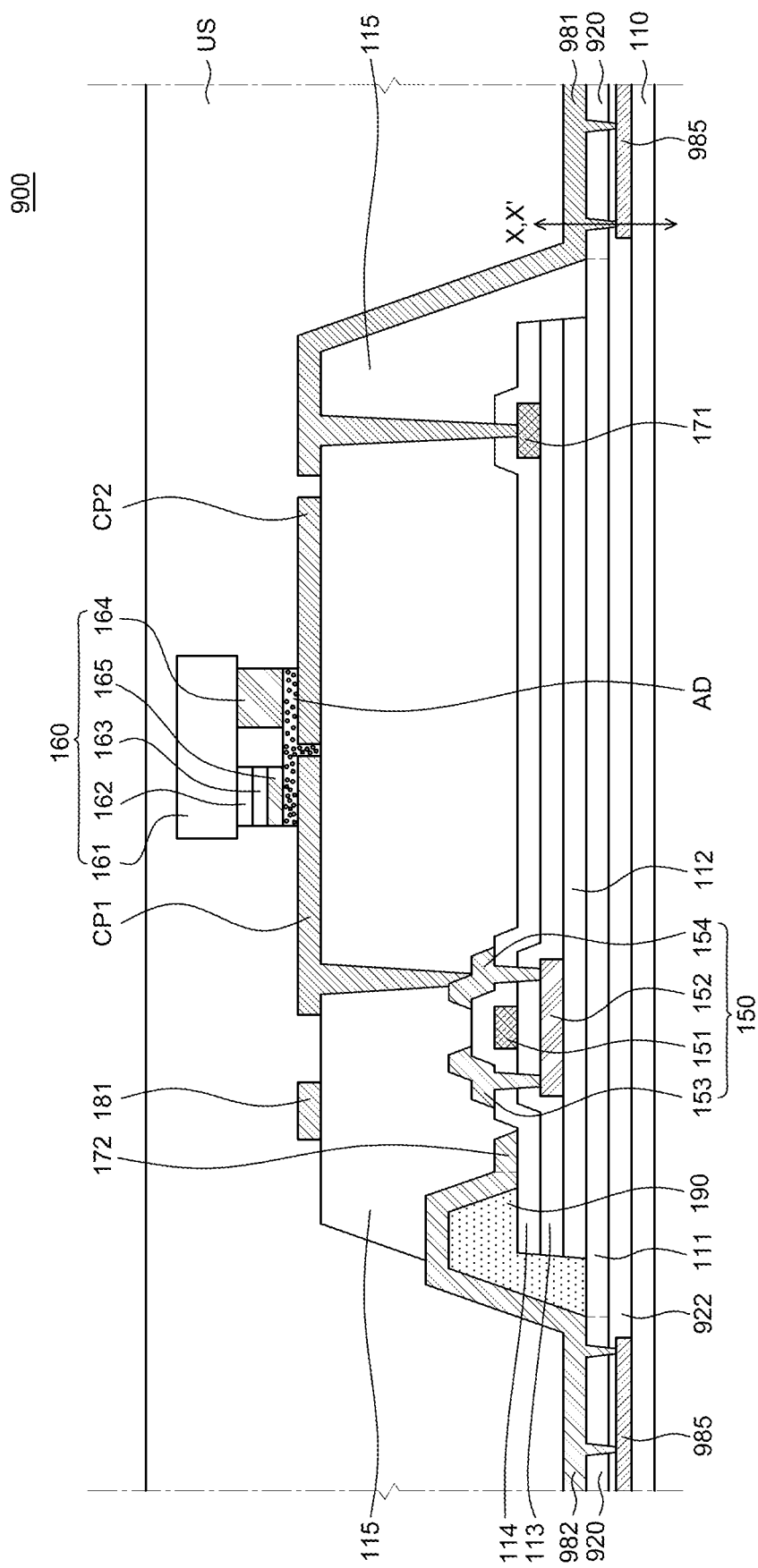
FIG. 9 is a schematic cross-sectional view of one sub pixel of a stretchable display device according to still another embodiment of the present disclosure.
Figure 10:
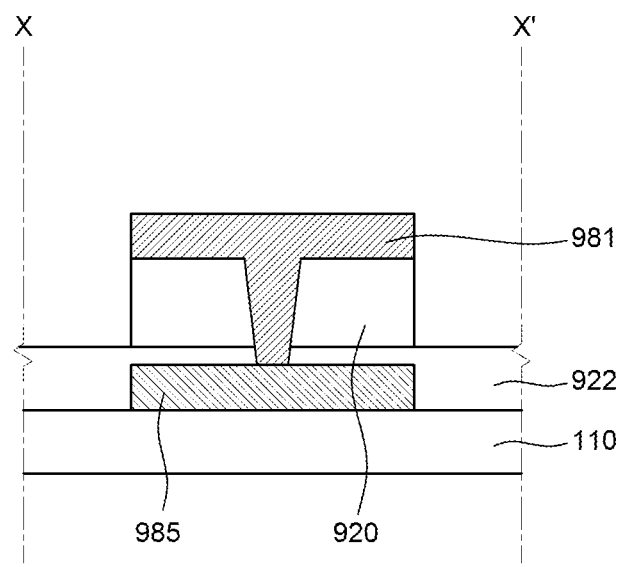
FIG. 10 is a cross-sectional view taken along the line X-X' of FIG. 9.

FIG. 9 is a schematic cross-sectional view of one sub pixel of a stretchable display device according to still another embodiment of the present disclosure. FIG. 10 is a cross-sectional view taken along the line X-X' of FIG. 9. The only difference between a stretchable display device 900 of FIGS. 9 and 10 and the stretchable display device 100 of FIGS. 1 to 3 is that a sub substrate 922 is added and a plurality of connection lines is provided, but the other configuration is the same or substantially the same, so that a redundant description will be omitted.

Referring to FIG. 9, the stretchable display device 900 includes a sub substrate 922. The sub substrate 922 may be disposed between the lower substrate 110 and the plurality of first substrates 111 and a plurality of second substrates 920. The sub substrate 922 may be configured with the same or substantially the same material as the plurality of first substrates 111 or the plurality of second substrates 920, but is not limited thereto.

Referring to FIG. 9, the plurality of connection lines includes a plurality of fifth connection lines 985. The plurality of fifth connection lines 985 may be disposed between the sub substrate 922 and the plurality of second substrates 920. The plurality of fifth connection lines 985 may be configured by the same or substantially the same material as the plurality of first connection lines 981 or the plurality of second connection lines 982, but is not limited thereto. Therefore, the plurality of fifth connection lines 985 may be configured by a material different from that of the plurality of first connection lines 981 or the plurality of second connection lines 982.

Referring to FIGS. 9 and 10, the plurality of first connection lines 981 is electrically connected to the plurality of fifth connection lines 985. The plurality of first connection lines 981 may be electrically connected to the plurality of fifth connection lines 985 through one or more contact holes formed in the plurality of second substrates 920. As described above, the plurality of second connection lines 982 may also be electrically connected to the plurality of fifth connection lines 985 through one or more contact holes formed in the plurality of second substrates 920. Even though in FIG. 9, it is illustrated that the plurality of first connection lines 981 and the plurality of second connection lines 982 are connected to the plurality of fifth connection lines 985, the present disclosure is not limited thereto. Therefore, the plurality of fifth connection lines 985 may be connected to only one connection lines of the plurality of first connection lines 981 or the plurality of second connection lines 982.

In the stretchable display device 900 according to still another embodiment of the present disclosure, the plurality of fifth connection lines 985 is disposed between the sub substrate 922 and the plurality of second substrates 920. Further, the plurality of first connection lines 981 and the plurality of second connection lines 982 are disposed to be in contact with the plurality of fifth connection lines 985. By doing this, the resistance of the connection lines may be reduced. Therefore, in the stretchable display device 900 according to still another embodiment of the present disclosure, voltage drop of a signal transmitted through the connection line may be reduced. For example, the longer the lengths of the plurality of first connection lines 981 and the plurality of second connection lines 982, the larger the resistance. However, as described above, the plurality of first connection lines 981 and the plurality of second connection lines 982 have a wavy shape, like the second substrate 920 so that the resistance may be high as compared with a straight line shape. Therefore, the voltage transmitted through the plurality of first connection lines 981 and the plurality of second connection lines 982, for example, a high potential voltage and a low potential voltage may drop or rise so that voltages which are transmitted to the sub pixels SPX may vary. As a result, a luminance of each sub pixel SPX may be irregular. Accordingly, in the stretchable display device 900 according to still another embodiment of the present disclosure, the plurality of first connection lines 981 and the plurality of second connection lines 982 are disposed to be in contact with the plurality of fifth connection lines 985 disposed between the sub substrate 922 and the plurality of second substrate 920. By doing this, the resistance generated in the plurality of first connection lines 981 and the plurality of second connection lines 982 may be reduced and a voltage deviation in each sub pixel SPX is reduced so that the luminance irregularity in each sub pixel SPX may be reduced.

The embodiments of the present disclosure can also be described as follows:

According to an aspect of the present disclosure, a stretchable display device may include a lower substrate; a plurality of first substrates which is disposed on the lower substrate and defines a plurality of sub pixels, a plurality of second substrates which connects adjacent first substrates among the plurality of first substrates; a plurality of inorganic insulating layers disposed on the plurality of first substrates; an organic insulating layer which is disposed on the plurality of first substrates so as to cover top surfaces and side surfaces of the plurality of inorganic insulating layers; a plurality of first connection lines which is disposed on the organic insulating layer on the plurality of first substrates and is disposed on a second substrate extending in a first direction, among the plurality of second substrates; a plurality of second connection lines which is disposed between the plurality of inorganic insulating layers and the organic insulating layer on the plurality of first substrates and is disposed on a second substrate extending in a second direction which is different from the first direction, among the plurality of second substrates; and a step alleviating layer disposed between the plurality of second connection lines and the plurality of inorganic insulating layers.

The plurality of first connection lines and the plurality of second connection lines may be configured by different materials.

The plurality of first connection lines may be disposed on a different layer from that of the plurality of second connection lines.

The plurality of first connection lines and the plurality of second connection lines may overlap with each other on the plurality of first substrates.

A plurality of third connection lines which is disposed between the plurality of inorganic insulating layers and the organic insulating layer on the plurality of first substrates and may be disposed on the second substrate extending in the first direction to be in contact with bottom surfaces of the plurality of first connection lines.

The plurality of first connection lines may be disposed to enclose top surfaces and side surfaces of the plurality of third connection lines.

The step alleviating layer may be disposed between the plurality of third connection lines and the plurality of inorganic insulating layers.

The stretchable display device may further include a plurality of fourth connection lines which is disposed on the organic insulating layer and is disposed to be in contact with top surfaces of the plurality of second connection lines on the second substrate extending in the second direction.

The step alleviating layer may be disposed to cover a part of the top surfaces and the side surfaces of the plurality of inorganic insulating layers at an end of the plurality of first substrates.

The step alleviating layer may be disposed to cover the top surfaces of the plurality of inorganic insulating layers.

The stretchable display device may further include a light emitting diode disposed in a groove disposed in a part of a top surface of the organic insulating layer, on the organic insulating layer.

The stretchable display device may further include a sub substrate which is disposed between the lower substrate and the plurality of first substrates and the plurality of second substrates; and a plurality of fifth connection lines which is disposed between the sub substrate and the plurality of second substrates and is electrically connected to the plurality of first connection lines or the plurality of second connection lines.

The step alleviating layer may be configured by the same or substantially the same material as the organic insulating layer.

The step alleviating layer may be formed of an organic material having an adhesiveness with the plurality of second connection lines stronger than the organic insulating layer.

According to another aspect of the present disclosure, a stretchable display device may include a plurality of rigid substrates which is disposed on a soft substrate and includes a plurality of display elements; a plurality of connection substrates which connects the plurality of rigid substrates between the plurality of rigid substrates; a plurality of inorganic insulating layers disposed on the plurality of rigid substrates; a step alleviating layer which is disposed to cover at least a part of the plurality of inorganic insulating layers; an organic insulating layer disposed on the step alleviating layer; a plurality of first connection lines which is disposed on the organic insulating layer and is disposed on the plurality of connection substrates disposed in one direction; and a plurality of second connection lines which is disposed on a layer different from that of the plurality of first connection lines and extends in a direction different from the plurality of first connection lines.

The stretchable display device may further include a plurality of third connection lines which is disposed to be in contact with the plurality of first connection lines; and a plurality of fourth connection lines which is disposed to be in contact with the plurality of second connection lines; wherein the plurality of first connection lines and the plurality of third connection lines and the plurality of second connection lines and the plurality of fourth connection lines are disposed to have a parallel structure, respectively.

The step alleviating layer may be disposed on the plurality of rigid substrates to enclose the plurality of inorganic insulating layers.

The stretchable display device may further include a sub substrate which is disposed between the soft substrate and the plurality of rigid substrates and the plurality of connection substrates; and a plurality of fifth connection lines which is disposed on a top surface of the soft substrate to be electrically connected to the plurality of first connection lines or the plurality of second connection lines.

The stretchable display device may further include a plurality of conductive elements disposed on the plurality of first substrates, wherein the plurality of second connection lines is disposed to have the same or substantially the same material as at least one of the plurality of conductive elements.

The step alleviating layer may be formed of an organic material having a high adhesiveness with the plurality of second connection lines.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate;
   a plurality of first substrates which is disposed on the lower substrate and defines a plurality of sub pixels;
   a plurality of second substrates which connects adjacent first substrates among the plurality of first substrates;
   a plurality of inorganic insulating layers disposed on the plurality of first substrates;
   an organic insulating layer which is disposed on the plurality of first substrates so as to cover top surfaces and side surfaces of the plurality of inorganic insulating layers;
   a plurality of first connection lines which is disposed on the organic insulating layer on the plurality of first substrates and is disposed on a second substrate extending in a first direction, among the plurality of second substrates;
   a plurality of second connection lines which is disposed between the plurality of inorganic insulating layers and the organic insulating layer on the plurality of first substrates and is disposed on a second substrate extending in a second direction which is different from the first direction, among the plurality of second substrates; and
   a step alleviating layer disposed between the plurality of second connection lines and the plurality of inorganic insulating layers.

2. The stretchable display device according to claim 1, wherein the plurality of first connection lines and the plurality of second connection lines include different materials.

3. The stretchable display device according to claim 1, wherein the plurality of first connection lines is disposed on a different layer from the plurality of second connection lines.

4. The stretchable display device according to claim 1, wherein the plurality of first connection lines and the plurality of second connection lines overlap with each other on the plurality of first substrates.

5. The stretchable display device according to claim 1, further comprising:
   a plurality of third connection lines which is disposed between the plurality of inorganic insulating layers and the organic insulating layer on the plurality of first substrates and is disposed on the second substrate extending in the first direction to be in contact with bottom surfaces of the plurality of first connection lines.

6. The stretchable display device according to claim 5, wherein the plurality of first connection lines is disposed to enclose top surfaces and side surfaces of the plurality of third connection lines.

7. The stretchable display device according to claim 5, wherein the step alleviating layer is disposed between the plurality of third connection lines and the plurality of inorganic insulating layers.

8. The stretchable display device according to claim 1, further comprising:
a plurality of fourth connection lines which is disposed on the organic insulating layer and is disposed to be in contact with top surfaces of the plurality of second connection lines on the second substrate extending in the second direction.

9. The stretchable display device according to claim 1, wherein the step alleviating layer is disposed to cover a part of the top surfaces and the side surfaces of the plurality of inorganic insulating layers at an end of the plurality of first substrates.

10. The stretchable display device according to claim 9, wherein the step alleviating layer is disposed to cover the top surfaces of the plurality of inorganic insulating layers.

11. The stretchable display device according to claim 9, further comprising:
a light emitting diode disposed in a groove disposed in a part of a top surface of the organic insulating layer, on the organic insulating layer.

12. The stretchable display device according to claim 1, further comprising:
a sub substrate which is disposed between the lower substrate and the plurality of first substrates and the plurality of second substrates; and
a plurality of fifth connection lines which is disposed between the sub substrate and the plurality of second substrates and is electrically connected to the plurality of first connection lines or the plurality of second connection lines.

13. The stretchable display device according to claim 1, wherein the step alleviating layer is configured by the same or substantially the same material as the organic insulating layer.

14. The stretchable display device according to claim 1, wherein the step alleviating layer is formed of an organic material having an adhesiveness with the plurality of second connection lines stronger than the organic insulating layer.

15. A stretchable display device, comprising:
a soft substrate;
a plurality of rigid substrates which is disposed on the soft substrate and includes a plurality of display elements;
a plurality of connection substrates which connects the plurality of rigid substrates between the plurality of rigid substrates;
a plurality of inorganic insulating layers disposed on the plurality of rigid substrates;
a step alleviating layer which is disposed to cover at least a part of the plurality of inorganic insulating layers;
an organic insulating layer disposed on the step alleviating layer;
a plurality of first connection lines which is disposed on the organic insulating layer and is disposed on the plurality of connection substrates disposed in one direction; and
a plurality of second connection lines which is disposed on a layer different from that of the plurality of first connection lines and extends in a direction different from the plurality of first connection lines.

16. The stretchable display device according to claim 15, further comprising:
a plurality of third connection lines which is disposed to be in contact with the plurality of first connection lines; and
a plurality of fourth connection lines which is disposed to be in contact with the plurality of second connection lines,
wherein the plurality of first connection lines and the plurality of third connection lines and the plurality of second connection lines and the plurality of fourth connection lines are disposed to have a parallel structure, respectively.

17. The stretchable display device according to claim 15, wherein the step alleviating layer is disposed on the plurality of rigid substrates to enclose the plurality of inorganic insulating layers.

18. The stretchable display device according to claim 15, further comprising:
a sub substrate which is disposed between the soft substrate and the plurality of rigid substrates and the plurality of connection substrates; and
a plurality of fifth connection lines which is disposed on a top surface of the soft substrate to be electrically connected to the plurality of first connection lines or the plurality of second connection lines.

19. The stretchable display device according to claim 15, further comprising:
a plurality of conductive elements disposed on the plurality of first substrates,
wherein the plurality of second connection lines is disposed to have the same or substantially the same material as at least one of the plurality of conductive elements.

20. The stretchable display device according to claim 15, wherein the step alleviating layer is formed of an organic material having a high adhesiveness with the plurality of second connection lines.

21. The stretchable display device of claim 15, wherein the plurality of rigid substrates is relatively rigid than the soft substrate.

* * * * *